(12) United States Patent
Nakazawa et al.

(10) Patent No.: US 6,753,882 B2
(45) Date of Patent: Jun. 22, 2004

(54) WRIST AUDIO PLAYER SYSTEM AND WRIST AUDIO PLAYER DEVICE

(75) Inventors: Akira Nakazawa, Akishima (JP); Shoichi Nagatomo, Fussa (JP)

(73) Assignee: Casio Computer Co., Ltd., Tokyo (JP)

( * ) Notice: Subject to any disclaimer, the term of this patent is extended or adjusted under 35 U.S.C. 154(b) by 556 days.

(21) Appl. No.: 09/768,547

(22) Filed: Jan. 24, 2001

(65) Prior Publication Data

US 2001/0010663 A1 Aug. 2, 2001

(30) Foreign Application Priority Data

Jan. 31, 2000 (JP) .......................... 2000-022448
Jan. 31, 2000 (JP) .......................... 2000-022527
Dec. 4, 2000 (JP) .......................... 2000-368808

(51) Int. Cl.$^7$ ............................................. G06F 12/00
(52) U.S. Cl. ...................................... 345/708; 345/768
(58) Field of Search ................................ 345/723, 722, 345/716, 717, 725, 726, 730, 732, 708, 768

(56) References Cited

U.S. PATENT DOCUMENTS

| | | | | |
|---|---|---|---|---|
| 5,861,880 A | * | 1/1999 | Shimizu et al. | ............. 345/302 |
| 6,246,401 B1 | * | 6/2001 | Setogawa et al. | ........... 345/723 |
| 6,452,612 B1 | * | 9/2002 | Holtz et al. | ................. 345/723 |
| 6,587,127 B1 | * | 7/2003 | Leeke et al. | ................ 345/765 |

* cited by examiner

Primary Examiner—Cao (Kevin) Nguyen
(74) Attorney, Agent, or Firm—Frishauf, Holtz, Goodman & Chick, P.C.

(57) ABSTRACT

A graphic data creating and editing system which can create and edit a graphic data to be displayed when playing music, corresponding to an audio data, and which can efficiently store the audio data and the graphic data in a semiconductor memory. The graphic data creating and editing system separates a plurality of audio data corresponding to the music to be played on the digital audio player (wrist audio player 3) and a plurality of graphic data (illustration and animation) to be displayed on the digital audio player, according to the audio data into each individual storage area, respectively, creates a data format wherein the audio data and the graphic data are corresponded to each other by the address, and stores the data format in the MMC 35.

2 Claims, 18 Drawing Sheets

FIG.6

| | | |
|---|---|---|
| 0 'Blues' | 20 'Alternative' | 60 'Top40' |
| 1 'Classic Rock' | 21 'Ska' | 61 'Christian Rap' |
| 2 'Country' | 22 'Death Metal' | 62 'Pop/Funk' |
| 3 'Dance' | 23 'Pranks' | 63 'Jungle' |
| 4 'Disco' | 24 'Soundtrack' | 64 'Native American' |
| 5 'Funk' | 25 'Euro-Techno' | 65 'Cabaret' |
| 6 'Grunge' | 26 'Ambient' | 66 'New Wave' |
| 7 'Hip-Hop' | 27 'Trip-Hop' | 67 'Psychadelic' |
| 8 'Jazz' | 28 'Vocal' | 68 'Rave' |
| 9 'Metal' | 29 'Jazz+Funk' | 69 'Showtunes' |
| 10 'New Age' | 30 'Fusion' | 70 'Trailer' |
| 11 'Oldies' | 31 'Trance' | 71 'Lo-Fi' |
| 12 'Other' | 32 'Classical' | 72 'Tribal' |
| 13 'Pop' | 33 'Instrumental' | 73 'Acid Punk' |
| 14 'R&B' | 34 'Acid' | 74 'Acid Jazz' |
| 15 'Rap' | 35 'House' | 75 'Polka' |
| 16 'Reggae' | 36 'Game' | 76 'Retro' |
| 17 'Rock' | 37 'Sound Clip' | 77 'Musical' |
| 18 'Techno' | 38 'Gospel' | 78 'Rock&Roll' |
| 19 'Industrial' | 39 'Noise' | 79 'Hard Rock' |
| | 40 'Altern Rock' | |
| | 41 'Bass' | |
| | 42 'Soul' | |
| | 43 'Punk' | |
| | 44 'Space' | |
| | 45 'Meditative' | |
| | 46 'Instrumental Pop' | |
| | 47 'Instrumental Rock' | |
| | 48 'Ethnic' | |
| | 49 'Gothic' | |
| | 50 'Darkwave' | |
| | 51 'Techno-Industrial' | |
| | 52 'Electronic' | |
| | 53 'Pop-Folk' | |
| | 54 'Eurodance' | |
| | 55 'Dream' | |
| | 56 'Southern Rock' | |
| | 57 'Comedy' | |
| | 58 'Cult' | |
| | 59 'Gangsta' | |

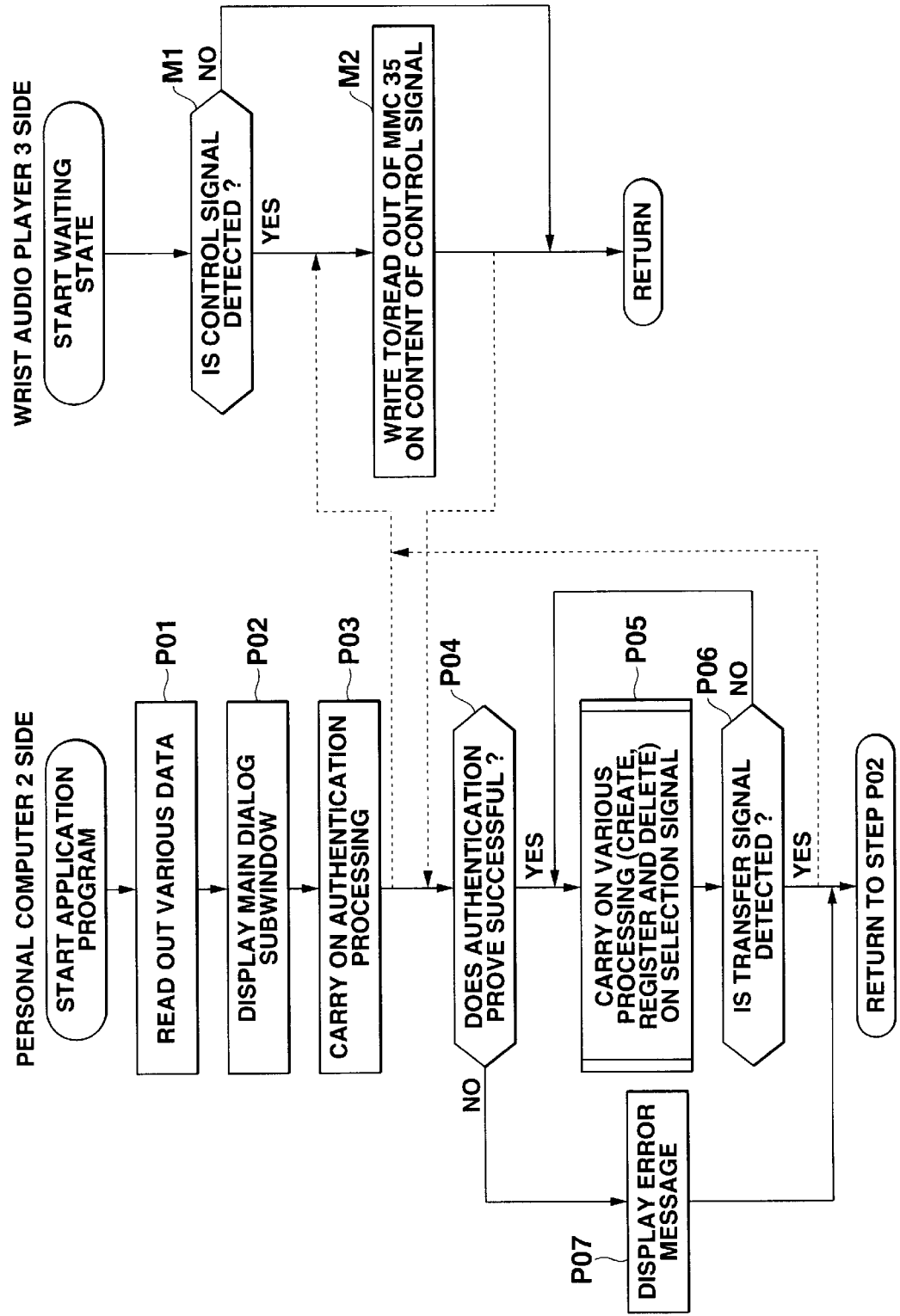

WRIST AUDIO PLAYER SYSTEM AND WRIST AUDIO PLAYER DEVICE

BACKGROUND OF THE INVENTION

1. Field of the Invention

The present invention relates to a graphic data creating and editing system for a digital audio player, a digital audio player, a method for creating and editing a graphic data, a computer-readable storage medium having a computer-practicable program recorded thereon, and a data signal transmitting a computer-practicable program.

2. Description of Related Art

According to an earlier development, a digital audio player playing music corresponding to an audio data obtained by processing an audio data compressed in a MP3 (MPEG Audio Layer 3) system, is known.

A data compression system termed the MP3 is mainly applied to recording an audio data and to playing music on the basis of the audio data, wherein the audio data is included in a MPEG (Moving Picture Experts Group) that is a motion picture compression/expand protocol.

Accordingly, if the data compression system is applied to the digital audio player, it is possible to efficiently compress the audio data without degrading a quality of a sound before being compressed.

Further, a digital audio player playing music on the basis of an audio data compressed in the MP3 system has a merit that the digital audio player is smaller and saves an electric power as compared with a conventional CD (Compact Disc) player, because the digital audio player doesn't such a driving system for controlling a function of playing music as a motor or the like.

And further, a digital audio player among the digital audio players as described above, is composed so that a semiconductor memory formed as a card, for storing the audio data therein can be installed in and taken away the digital audio player body.

And in the future, a memory capacity of the semiconductor memory as described above will increase. As a result, it is expected that the semiconductor memory can storage an audio data and also such a graphic data, for example, as a film.

However, the MP3 as described above shows an effect thereof only when compressing an audio data. Therefore, a graphic data on a display is a data in a conventional text style. Accordingly, if the digital audio player comprises a display function, the digital audio player could only display an index data and so on in a text style.

Further, most application program for compressing an audio data to MP3 according to an earlier development comprises only a compression function of the audio data and an editing function of an ID3TAG data on the display of the index data as described above. Accordingly, if the digital audio player comprises a display function, a user could only edit an uninteresting display in a text style.

SUMMARY OF THE INVENTION

The present invention was developed in view of the above-described problems.

An object of the present invention is to provide a graphic data creating and editing system which can create and edit a graphic data to be displayed when playing music, corresponding to an audio data, and which can efficiently store the audio data and the graphic data in a semiconductor memory.

Another object of the present invention is to provide a digital audio player which reads a graphic data stored in a semiconductor memory, corresponding to an audio data stored in the semiconductor memory and displays the graphic data, at the same time to play music on the basis of the audio data.

A further object of the present invention is to provide a method for creating and editing a graphic data, wherein the method can create and edit a graphic data to be displayed when playing music, corresponding to an audio data, and efficiently store the audio data and the graphic data in a semiconductor memory.

A further object of the present invention is to provide a computer-readable storage medium having a method for creating and editing a graphic data as a computer-practicable program recorded thereon, wherein the method can create and edit a graphic data to be displayed when playing music, corresponding to an audio data, and efficiently store the audio data and the graphic data in a semiconductor memory.

A further object of the present invention is to provide a data signal transmitting a method for creating and editing a graphic data as a computer-practicable program, wherein the method can create and edit a graphic data to be displayed when playing music, corresponding to an audio data, and efficiently store the audio data and the graphic data in a semiconductor memory.

In order to solve a problem of the present invention, according to a graphic data creating and editing system for a digital audio player comprising at least a display unit and a storage unit, the digital audio player for playing music on the basis of an audio data stored in the storage unit, the graphic data creating and editing system comprises: a graphic data creating section for creating a graphic data corresponding to an image to be displayed on the display unit; and a writing section for writing an audio data corresponding to a music to be played on the digital audio player, a display data on the audio data and a graphic data created by the graphic data creating section to an individual storage area of the storage unit of the digital audio player respectively, wherein the audio data, the display data and the graphic data are related to each other.

In order to solve another problem of the present invention, a digital audio player comprises: a storage section having an audio data storage area in which a plurality of audio data is stored, a display data storage area in which a plurality of display data on the audio data is stored, and a graphic data storage area in which a graphic data is stored; a playing section for playing music on the basis of the audio data stored in the audio data storage area; a display section for displaying the display data stored in the display data storage area, thereon; a selecting section for selecting the display data of the audio data to be played, from the display data displayed on the display section; a reading section for reading the graphic data out of the graphic data storage area when the display data is selected by the selecting section; an instruction section for instructing the playing section to play music; and an image display section for displaying an image thereon, on the basis of the graphic data read out by the reading section, when the instruction section instructs the playing section to play music and the playing section starts playing music.

In order to solve a further problem of the present invention, according to a method for creating and editing a graphic data, carried on by a digital audio player comprising at least a display unit and a storage unit, the digital audio player for playing music on the basis of an audio data stored in the storage unit, the method comprises the steps of: creating a graphic data corresponding to an image to be displayed on the display unit; and writing an audio data corresponding to a music to be played on the digital audio player, a display data on the audio data and the graphic data created to an individual storage area of the storage unit of the digital audio player respectively, wherein the audio data, the display data and the graphic data are related to each other.

In order to solve a further problem of the present invention, according to a computer-readable storage medium having a computer-practicable program recorded thereon, so that a digital audio player comprising at least a display unit and a storage unit, for playing music on the basis of an audio data stored in the storage unit, creates and edits a graphic data, the program comprises: a program code of creating a graphic data corresponding to an image to be displayed on the display unit; and a program code of writing an audio data corresponding to a music to be played on the digital audio player, a display data on the audio data and the graphic data created to an individual storage area of the storage unit of the digital audio player respectively, wherein the audio data, the display data and the graphic data are related to each other.

In order to solve a further problem of the present invention, according to a data signal transmitting a computer-practicable program, so that a digital audio player comprising at least a display unit and a storage unit, for playing music on the basis of an audio data stored in the storage unit, creates and edits a graphic data, the data signal comprises: a data block having a program of creating a graphic data corresponding to an image to be displayed on the display unit, recorded thereon; and a data block having a program of writing an audio data corresponding to a music to be played on the digital audio player, a display data on the audio data and the graphic data created to an individual storage area of the storage unit of the digital audio player respectively, wherein the audio data, the display data and the graphic data are related to each other, recorded thereon.

According to the present invention, it is possible to provide a graphic data creating and editing system, a digital audio player, a method for creating and editing a graphic data, a computer-readable storage medium and a data signal which can create and edit a graphic data to be displayed when playing music, corresponding to an audio data, and which can efficiently store the audio data and a graphic data in a semiconductor memory.

BRIEF DESCRIPTION OF THE DRAWINGS

The present invention will become more fully understood from the detailed description given hereinafter and the accompanying drawings which are given by way of illustration only, and thus are not intended as a definition of the limits of the present invention, and wherein:

FIG. 6 is a view showing an example of a type of genre set in an ID3TAG data;

FIG. 7 is a flowchart for explaining a flow of a data transfer between the personal computer 2 and the wrist audio player 3;

PREFERRED EMBODIMENT OF THE INVENTION

Hereinafter, an embodiment of a graphic data creating and editing system, a digital audio player, a method for creating and editing a graphic data, a storage medium and a data signal of the present invention will be explained with reference to figures, in detail.

First, a structure will be explained as follows.

Figure 1:
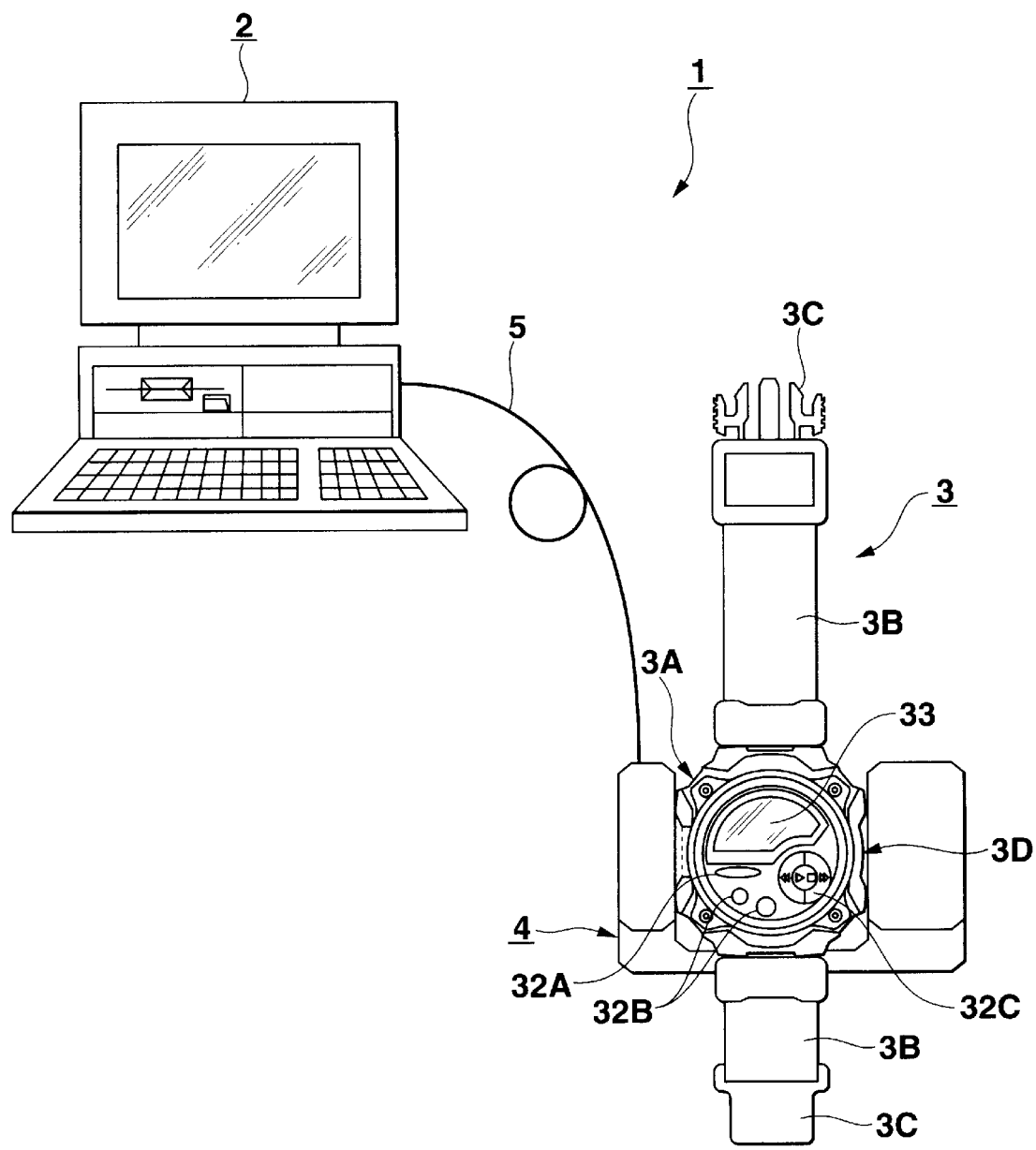
FIG. 1 is a view showing a schematic structure of a graphic data creating an editing system 1.
Figure 2:
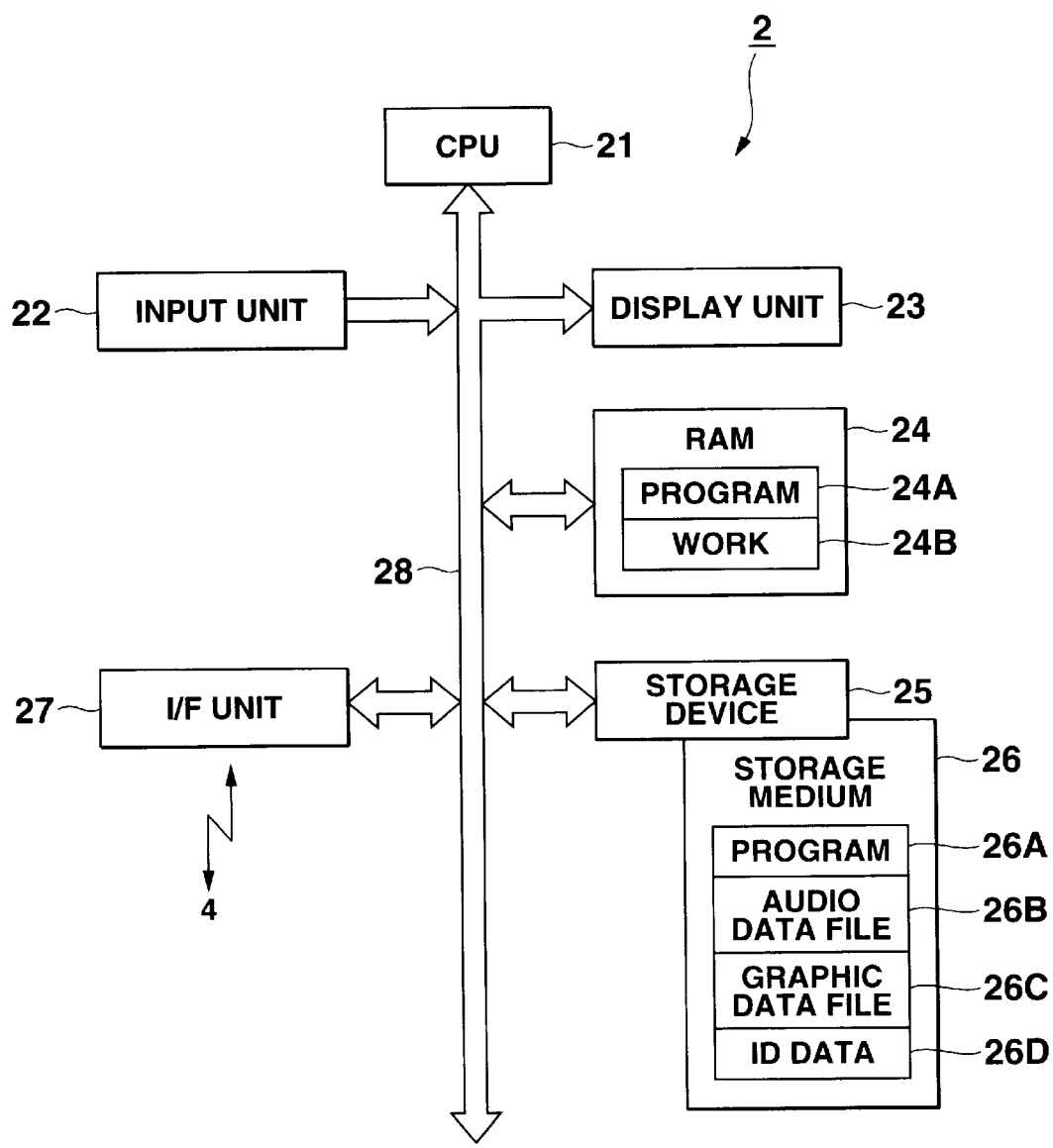
FIG. 2 is a block diagram showing a main structure of a personal computer 2.
Figure 3:
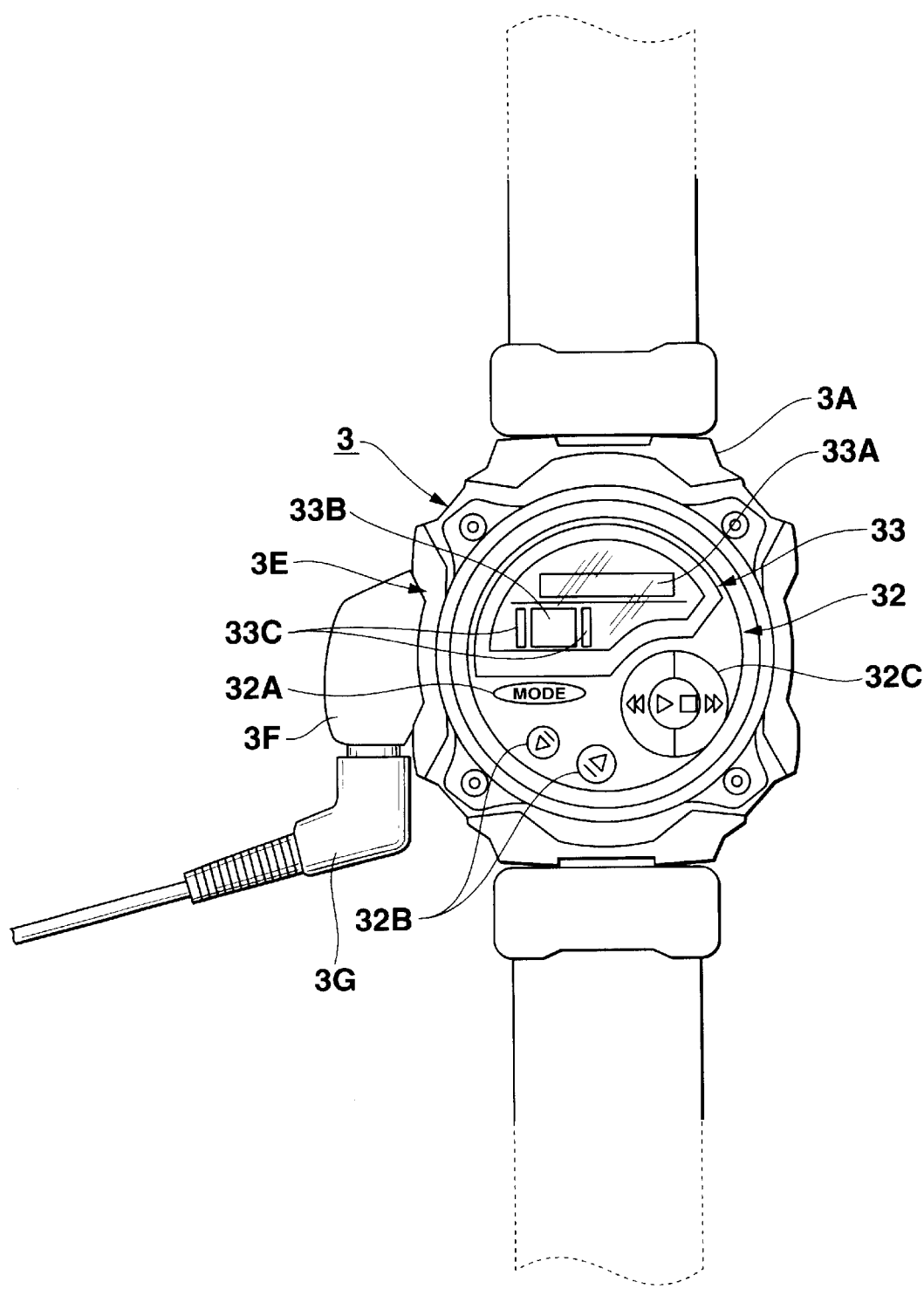
FIG. 3 is an enlarged elevational view of a head part 3A of a wrist audio player 3.
Figure 4:
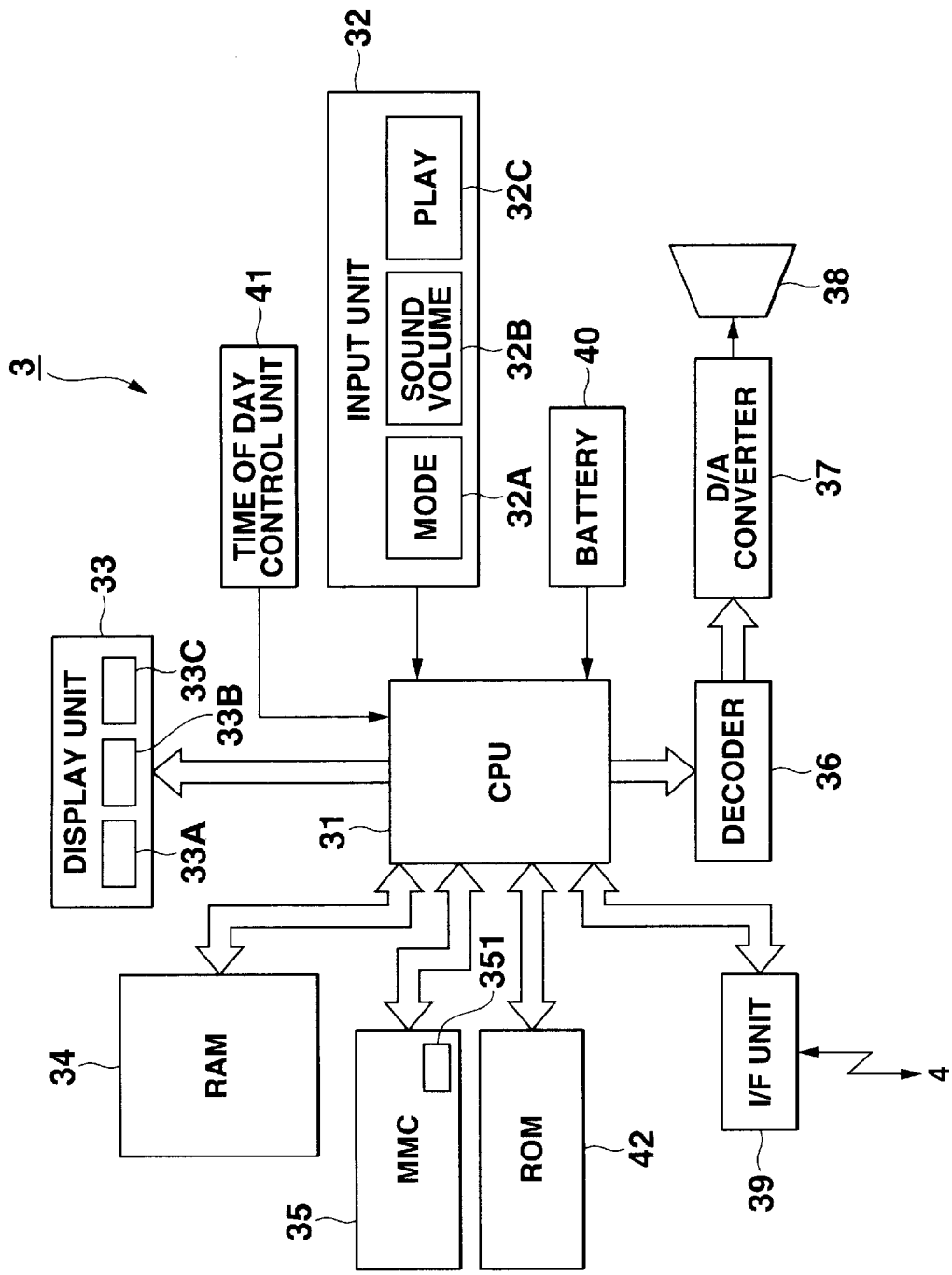
FIG. 4 is a block diagram showing a main structure of the wrist audio player 3.

FIG. 1 is a view showing a schematic structure of the graphic data creating and editing system 1. FIG. 2 is a block diagram showing a main structure of the personal computer 2. FIG. 3 is an enlarged elevational view of a head part 3A of a wrist audio player 3 as an example of the digital audio player. FIG. 4 is a block diagram showing a main structure of the wrist audio player 3.

The graphic data creating and editing system 1 of the present invention, is applied to a system wherein a plurality of terminals, for example, a plurality of personal computers and network servers are connected to each other through a wire or by a wireless, and a data can be transfer between the terminals.

As an example of an embodiment of the present invention, the graphic data creating and editing system 1 will be explained with reference to FIG. 1, as follows.

As shown in FIG. 1, according to the graphic data creating and editing system 1, the personal computer 2 as a terminal (a host) for transferring a data and the wrist audio player 3 as a terminal to which a data is transferred from the personal computer 2 are connected to each other through a cable 5 and a connection attachment 4.

First, the personal computer 2 will be explained.

According to the personal computer 2, a plurality of audio data and a plurality of graphic data are stored in such a storage medium 26 as a hard disc or the like. Further, according to the embodiment of the present invention, one data of the audio data and one data of the graphic data are corresponded to each other and stored in the storage medium 26.

The audio data is compressed and encoded, by such a predetermined audio encode system, for example, as a MP3 (MPEG Audio Layer III) or the like.

Figure 9:
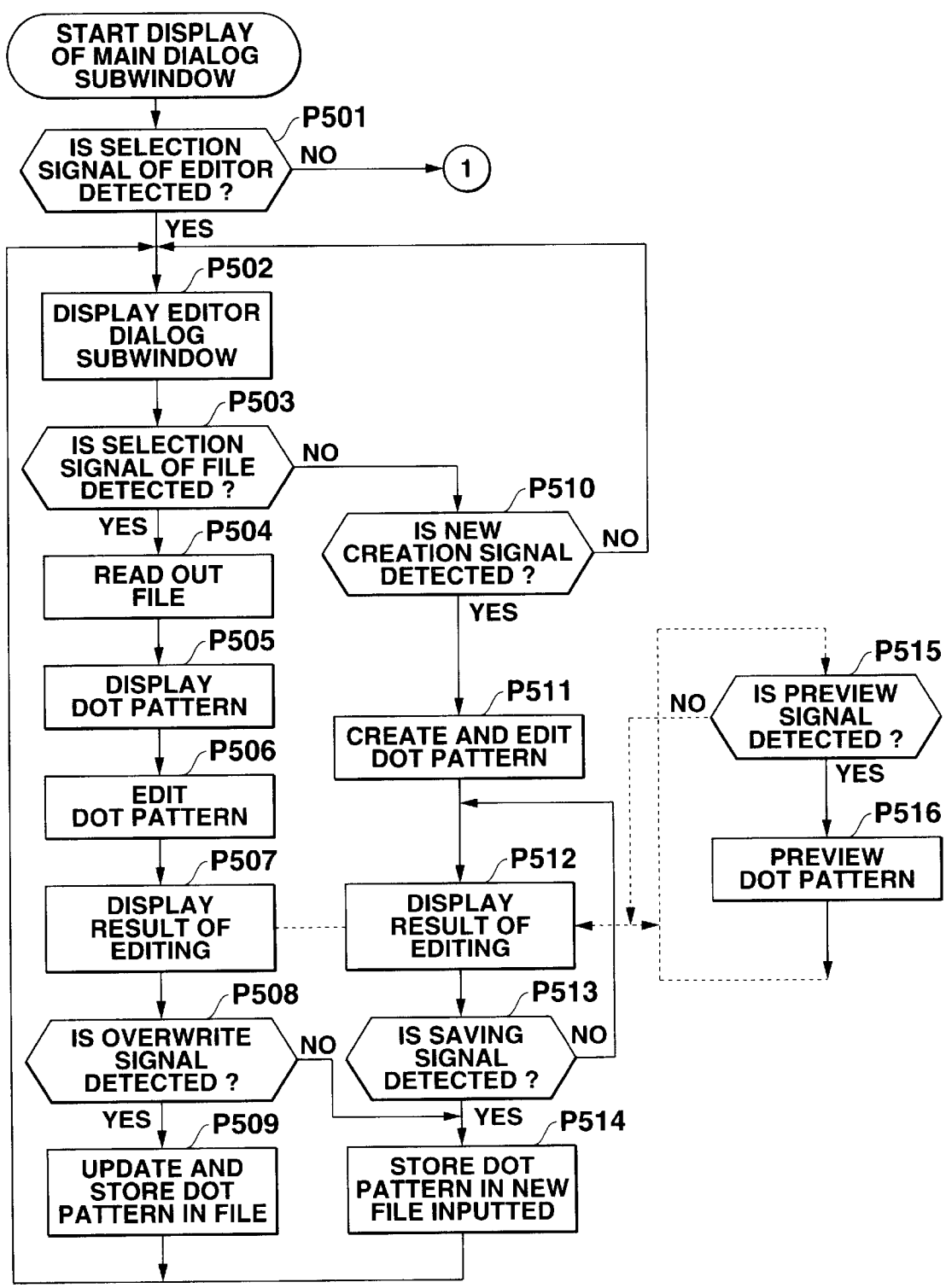
FIG. 9 is a flowchart for explaining a graphic data creating and editing processing carried on by the personal computer 2.
Figure 10:
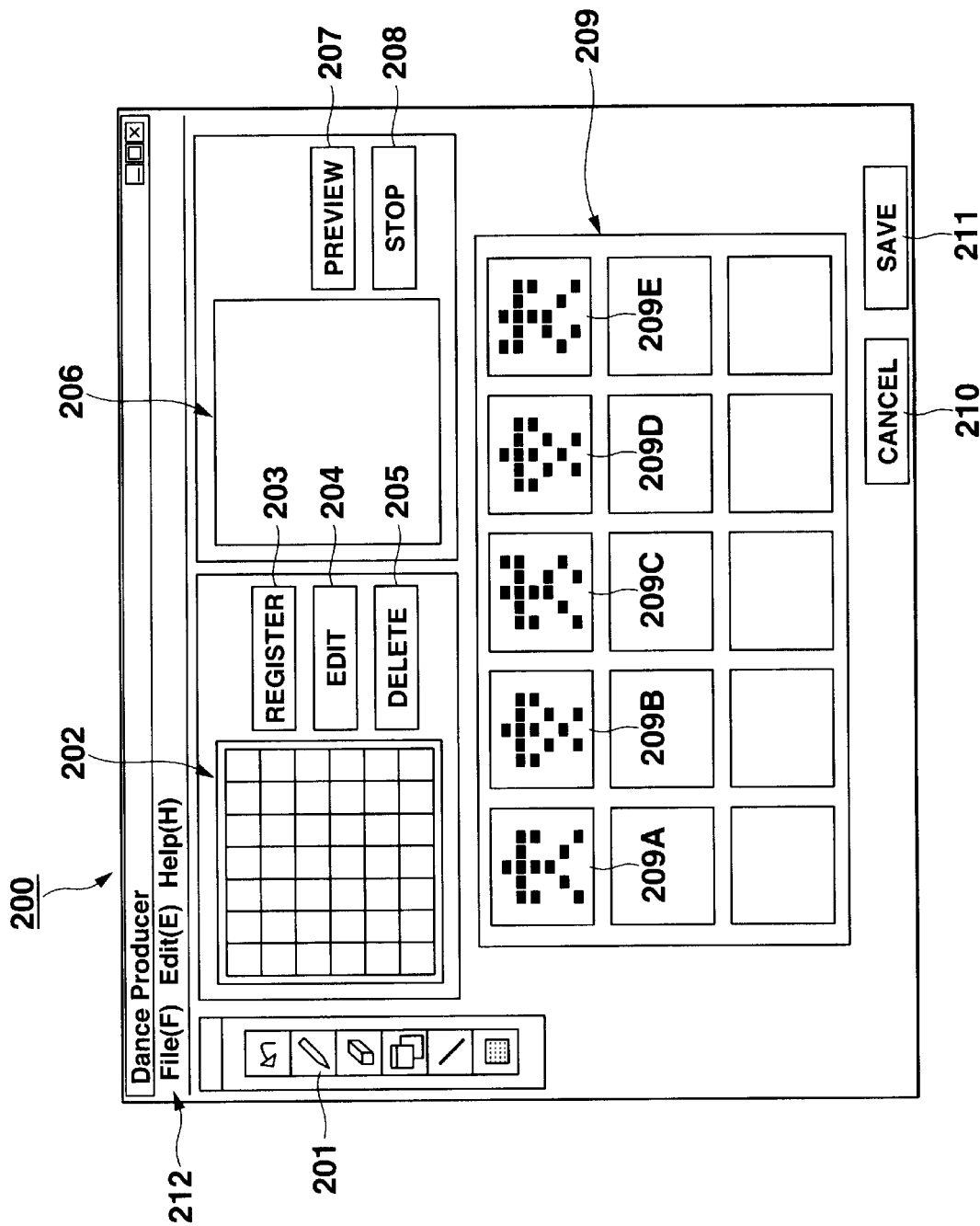
FIG. 10 is a view showing an example of a graphic data editor dialog subwindow 200 displayed on the display 23 of the personal computer 2.

The graphic data is created and edited, by the following graphic data creating and editing processing (refer to FIG. 9 and FIG. 10). Further, the graphic data is, for example, an illustration expressed in a dot pattern and an animation (following, the animation will be called a dance animation) expressed in a serial display of a plurality of illustrations. And further, the graphic data includes a static picture image and a motion picture image which are taken a picture with a camera not shown in figurers and downloaded from a network not show in figures. An image data of the picture image downloaded from the network may be processed in a data style and a compression ratio different from one of the audio data.

The personal computer 2 having the structure as described above, carries on various types of application programs as follows. Therefore, the personal computer 2 compresses and edits the audio data and the graphic data on the present invention in a predetermined data format, and creates a data. Thereafter, the personal computer 2 transfers the data to the wrist audio player 3 connected thereto.

Further, according to the personal computer 2, an individual management data including the ID3TAG data, to individually control the audio data and the graphic data is read out of the wrist audio player 3 and displayed on the display unit 23.

The interior construction of the personal computer 2 will be explained with reference to FIG. 2.

As shown in FIG. 2, the personal computer 2 comprises a CPU (Central Processing Unit) 21, an input unit 22, a display unit 23, a RAM (Random Access Memory) 24, a storage device 25, a storage medium 26 and an I/F unit 27, wherein each unit other than the storage medium 26 is connected to each other through a bus 28.

The storage device 25 comprises a reader/writer for reading out a program and a data stored in the storage medium 26 and writing a data created and edited to the storage medium 26.

The CPU 21 reads an application program and a data on the present invention out of the storage medium 26, on the basis of an instruction inputted through the input unit 22. Thereafter, the CPU 21 stores the application program and the data in a work memory 24B of the RAM 24 temporarily. And after, the CPU 21 carries on various processing on the present invention and controls each element of the personal computer 2 in a concentrated system.

Further, the CPU 21 stores a result of processing the application program in the RAM 2 one after another, and instructs the display unit 23 to display the result thereon. Further, the CPU 21 stores the result in the storage medium 26 through the storage device 25, on the basis of the instruction inputted through the input unit 22.

And further, the CPU 21 carries on an authentication processing, when the personal computer 2 is connected to the wrist audio player 3 through the connection attachment 4. When the authentication processing has proved successful, the CPU 21 instructs the display unit 23 to display a main dialog subwindow 100 (refer to FIG. 8) thereon. Thereafter, the CPU 21 carries on various processing according to an instruction operation of a user who has watched the main dialog subwindow 100.

The processing carried on by the CPU 21 includes the following graphic data creating and editing processing (refer to FIG. 9), the following data storage processing (refer to FIG. 11) for transferring a data to the side of the wrist audio player 3 and writing the data to a MMC 35 contained in the wrist audio player 3, and so on.

Various processing will be explained in detail, as follows.

The input unit 22 includes a keyboard having cursor keys, number input keys, various function keys and so on, for inputting various instructions and data and a mouse. The input unit 22 outputs a press signal of the key pressed and a positional signal of the mouse.

The display unit 23 is composed of a CRT (Cathode Ray Tube), a LCD (Liquid Crystal Display) or the like. The display unit 23 generates a signal on the basis of a display control instruction processed by the CPU 21 to display various images thereon.

The RAM 24 comprises a program storage memory 24A wherein the application program specified by the CPU 21 is developed and a work memory 24B for storing an input instruction, a processing result and so on temporarily.

The storage device 25 comprises the reader/writer and the storage medium 26 in which the program, the data and so on are stored previously.

The storage medium 26 is composed of a magnetic or optical storage medium or a semiconductor memory. The storage medium 26 is provided at the storage device 25 fixedly or so that the storage medium 26 can be installed in and taken away the storage device 25.

The storage medium 26 stores the system program of the personal computer 2, various application programs on the system of the present invention, the data processed and so on, therein.

The storage medium 26 comprises a program storage area 26A in which the application program on the present invention is stored, an audio data file storage area 26B in which a file composed of a plurality of audio data is controlled and a plurality of files are stored, a graphic data file storage area 26C in which a file composed of a plurality of graphic data (an illustration data, a dance animation, a static picture image and a motion picture image) is controlled and a plurality of files are stored, and an ID data storage area 26D in which a MMCID and a data ID used when the authentication processing of the data to be stored in a MMC 35 is carried on, are stored.

The MMCID to be stored in the ID data storage area 26D is composed of a manufacture ID, a product ID and a serial number, and is fixedly written to a register 351 of the MMC 35 when the MMC 35 is manufactured. Further, the data ID to be stored in the ID data storage area 26D is set and stored when the data ID is transferred.

The storage medium 26 may be composed so that one or all of various application programs and data stored in the storage medium 26, is received through a network and the I/F unit 27 from such another apparatus as a server, a client and so on and stored in the storage medium 26.

Further, the storage medium 26 may be controlled by a server which is constructed on the existing network.

And further, the storage medium 26 may be composed so as to transmit the application program to such another apparatus as the server, the client and so on through the network, to install it to the apparatus.

The I/F unit 27 is composed of a connecter, a MODEM (Modulator/Demodulator), or a TA (Terminal Adaptor) for connecting to an external personal computer, a server, the connection attachment 4, a portable telephone, a PHS (Personal Handyphone System) or the like, through a cable. Further, if the connection attachment 4 comprises an infrared rays communication device, a wireless communication device or the like, the I/F unit 27 is composed of a wireless communication unit or the like composed by using an infrared rays, an electromagnetic induction, an extremely feeble radio wave or the like.

Further, the CPU 21 controls the I/F unit 27 to communicate with an external apparatus through a telephone line, an ISDN (Integrated Services Digital Network) line, a wireless communication line or the like or a radio transmission.

The MODEM modulates a digital data processed by the CPU 21 to an analog signal fitted to a frequency band of the telephone line, in order to communicate with such an external apparatus as a personal computer or the like through the telephone line. Further, the MODEM demodulates the analog signal inputted through the telephone line to a digital signal.

The TA converts an existing interface to an interface corresponding to an ISDN line, in order to communicate with such an external apparatus as a personal computer or the like through the ISDN line.

The infrared rays communication unit composed of a light-emitting element and a light-receiving element not shown in figures. The light-emitting element is composed of a transmitting circuit incorporating an infrared rays diode in an internal thereof, and so on. Further, the light-emitting element emits an infrared rays having a predetermined frequency according to an instruction of the CPU 21. The light-receiving element is composed of a receiving circuit incorporating an infrared phototransistor in an internal thereof, and so on. Further, the light-receiving element receives the infrared rays emitted from another apparatus and outputs a reception signal showing a reception state to the CPU 21.

Further, the wireless communication unit composed by using a radio wave is composed of an antenna for receiving a radio wave, a modulation/demodulation circuit and so on.

Next, the wrist audio player 3 will be explained.

The wrist audio player 3 comprises a semiconductor storage medium 35 which is fixedly provided there at or which can be installed therein and taken away, wherein the semiconductor storage medium 35 contains such a storage medium, for example, as a non-volatile semiconductor storage element or the like as a flash memory or the like, and the semiconductor storage medium 35 has a small size and imitates a shape possible to be carried.

Further, the wrist audio player 3 comprises a playing function for playing music and outputting an image on the basis of the audio data and the graphic data stored in the MMC 35.

Further, the wrist audio player 3 has an external appearance that is a wristwatch type capable of being worn on a wrist and carried. As shown in FIG. 1, the wrist audio player 3 comprises a head part 3A, a pair of wristbands 3B and 3B disposed at an external edge portion of the head part 3A, so as to be stood opposite to each other, and buckles 3C and 3C provided at top edges of the wristbands 3B and 3B respectively and connected to each other so that the wrist audio player 3 can be worn on and taken away a wrist.

When the wrist audio player 3 is worn on a body, for example, a wrist, the wristbands 3B and 3B are bended and wrapped around a wrist or an upper arm, and after the buckles 3C and 3C are connected to each other.

And further, the wrist audio player 3 comprises an external apparatus connection connector part 3D and an earphone connection connecter part 3E at both sides thereof.

The external apparatus connection connector part 3D comprises an input terminal that is a pin insert hole for inputting a data transmitted through the connection attachment 4 from the personal computer 2 to the wrist audio player 3. The data transmitted is written on the MMC 35.

The earphone connection connecter part 3E comprises an output terminal to which an earphone connection adapter 3F shown in FIG. 3 is connected. The earphone connection connector part 3E outputs music to earphones or headphones connected through the earphone connection adapter 3F.

As shown in FIG. 3, a display unit 33 at which a display areas 33A, 33B and 33C are provided and an input unit 32 at which a mode button 32A, a sound volume button 32B and a play operation button 32C are provided are provided on a front surface of the head part 3A.

Further, in FIG. 3, the earphone connection adapter 3F is installed in the earphone connection connector part 3E and an earphone jack 3G is connected to the earphone connection adapter 3F.

The interior construction of the wrist audio player 3 will be explained with reference to FIG. 4.

As shown in FIG. 4, the wrist audio player 3 comprises a CPU 31, an input unit 32, a display unit 33, a RAM 34, a MMC 35, a decoder 36, a D/A converter 37, an audio output unit 38, an I/F unit 39, a battery 40, a time of day control unit 41 and a ROM 42.

The CPU 31 controls each part of the wrist audio player 3 according to a system program, a communication processing program or a play processing program stored in the ROM 42, in order to carry on and control a processing according to a mode on the basis of a key operation signal outputted from the mode button 32A of the input unit 32.

According to a communication mode in which the CPU 31 carries on the communication processing program, the CPU 31 reads a data out of the MMC 35, writes a data to the MMC 35, formats a data of the MMC 35 and so on, on the basis of various control signals transmitted from the personal computer 2.

Further, the CPU 31 transmits the data of the MMC 35 to the personal computer 2 through the connection attachment 4 according to a request from the personal computer 2.

Figure 12:
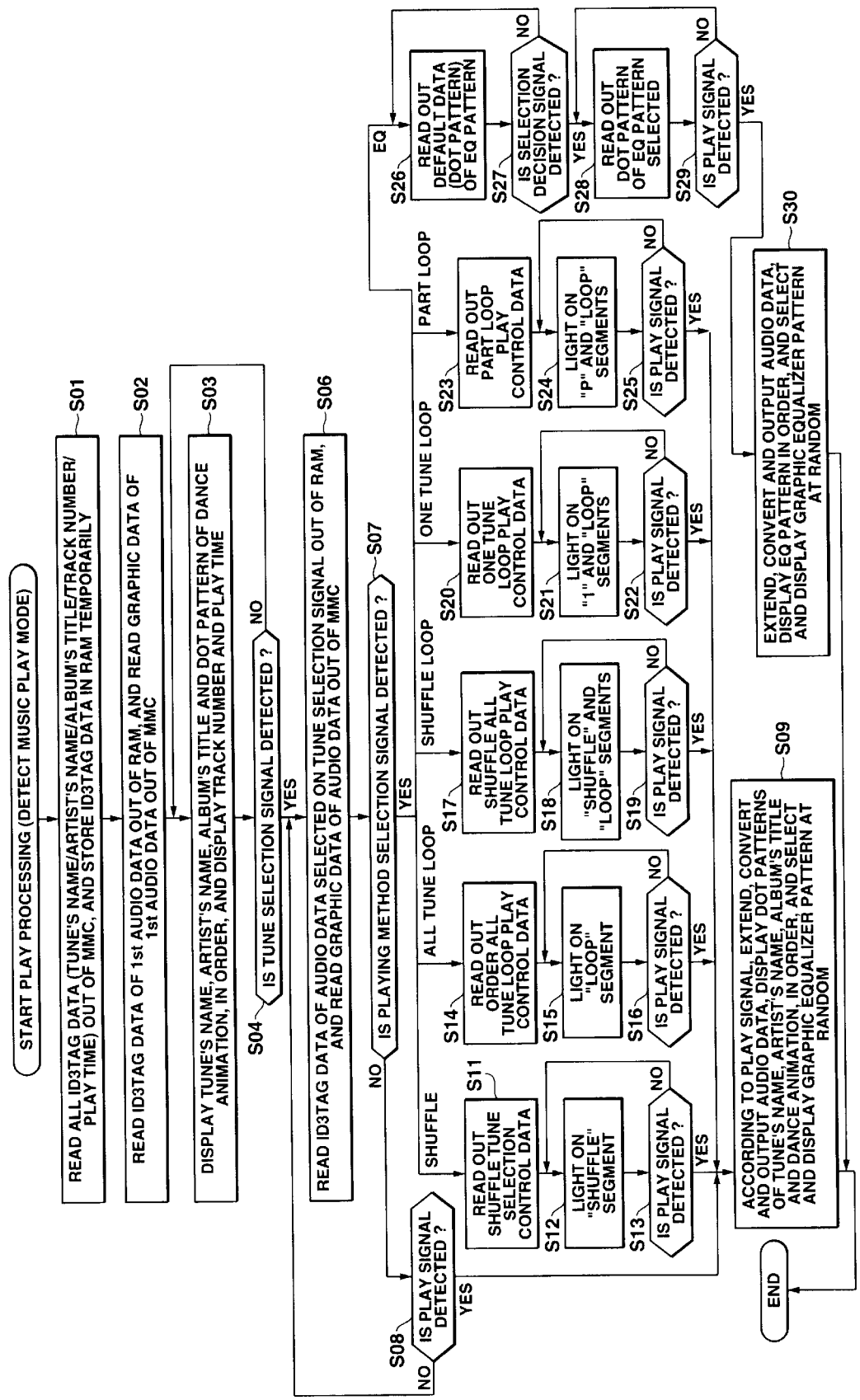
FIG. 12 is a flowchart for explaining a play processing carried on by the wrist audio player 3.

According to a play mode in which the CPU 31 carries on the play processing program, the CPU 31 plays music, displays an index data, displays an illustration, a dance animation and a frame animation and so on according to graphic data, on the basis of the audio data according to the following play processing program (refer to FIG. 12).

That is, the CPU 31 reads an ID3TAG data, a graphic data and an audio data included in an individual management data, out of the data stored in the MMC 35, according to an instruction outputted by operating the play operation button 32C of the input unit 32, and transmits them to the RAM 34.

Thereafter, the CPU 31 instructs the display areas 33B and 33C of the display unit to display the index (display data), the graphic and the dance animation on the basis of the ID3TAG data and the graphic data, plays music on the basis of the audio data, and outputs a sound from the audio output unit 38. Further, the CPU 31 instructs the display area 33A of the display unit to display a track number, a play time and so on, of the audio data corresponding to the music played, on the basis of the ID3TAG data of the individual management data.

Further, the CPU 31 finishes playing, fast-forwards and rewinds, according to an instruction outputted by operating the play operation button 32C of the input unit 32.

Further, according to the play mode, when the CPU 31 detects a selection signal for selecting an audio data corresponding to music to be played, the CPU 31 searches a start address of the audio data selected and detected from the individual management signal stored in the RAM 34. Thereafter, the CPU 31 searches a start address of the graphic data corresponding to the audio data.

Thereafter, the CPU 31 reads out the ID3TAG data (index) and the graphic data extracted as the result of searching and instructs the display area 33B of the display unit 33 to display them in order. To the ID3TAG data, a genre is previously standardized for specifying a characteristic of music to be played.

Therefore, the CPU 31 detects a tempo and a rhythm according the genre of the ID3TAG data, thereby the CPU 31 instructs the display unit 33 to display the dance animation as keeping the tempo and the rhythm. Further, the CPU 31 may count a tempo of music played by the time of day control unit 41, thereby the CPU 31 may instruct the display unit 33 to display the dance animation at the speed according to the count number.

And further, according to the play mode, when the playing method for playing music is changed by operating the mode button 32A, the CPU 31 reads a play control data corresponding to the playing method changed out of the ROM 42 and plays music according to the play control data read out.

The playing method comprises a "Sequential play" as a normal method, for sequentially playing music on the basis of all the audio data stored in the MMC 35, a "Shuffle" for playing music at random on the basis of the all the audio data stored in the MMC 35, an "All tune loop" for sequentially playing music continuously on the basis of the all the audio data stored in the MMC 35, a "Shuffle loop" for continuously playing music at random on the basis of all the audio data stored in the MMC 35, an "One tune loop" for continuously playing music on the basis of only the audio data selected, and a "Part loop" for continuously playing music on the basis of a specific phase of the audio data selected.

Further, when the CPU 31 plays music, the CPU 31 can set an equalizer (EQ) displayed as shown in FIG. 13 (display of an EQ).

According to a time mode in which the CPU 31 carries on the system program, the CPU 31 generates a display data for displaying a present time and a date on the basis of the time data measured by the time of day control unit 41, thereafter the CPU 31 instructs the display area 33A of the display unit 33 to display the present time and the date thereon.

Further, the CPU 31 carries on the time function, for example, the time correcting function and so on, according to the instruction inputted from the input unit 32, and instructs the display unit 33 to display the result of processing.

The time of day control unit 41 comprises an oscillator for oscillating an electric signal having a predetermined frequency and a frequency dividing circuit for generating a signal having a predetermined frequency by dividing the electric signal oscillated from the oscillator.

Further, the time of day control unit 41 transmits such the measured time data as the time, the date and so on to a time of day register, and sequentially updates it. And further, the time of day control unit 41 measures a tempo and a speed of music played, to output them to the CPU 31.

The display unit 33 comprises the display areas 33A, 33B and 33C, wherein the display data, for example, a graphic data, an index data and so on outputted from the CPU 31 are displayed thereon.

The display area 33A is an area wherein the truck number and the play time are displayed on the basis of the ID3TAG data corresponding to the music (the audio data) during play, in the play mode. Further, the display area 33A is an area wherein the present time is displayed, in the time mode.

The display area 33B has a display area size of 7 dots by 6. The display area 33B is an area wherein the index (text data) of the ID3TAG data is sequentially displayed one character after another character, in the play mode. The index is composed of a total of about 30 characters and numbers of "Tune's name", "Artist's name" and "Album's title" (refer to FIG. 14). Thereafter, the dance animation stored corresponding to the audio data is sequentially displayed on the display area 33B one frame after another frame, to the tempo and the rhythm of the music during playing (refer to FIG. 15).

The display areas 33C are disposed at both sides of the display area 33B and each display area 33C has the display area size of 1 dot by 6. The display areas 33C are areas wherein the graphic equalizer pattern selected at random is displayed continuously, in the play mode. The graphic equalizer patter is an animation of a dot pattern expressed by 1 dot by 6 and will be called a frame animation as follows (refer to FIG. 17).

The RAM 34 temporarily stores the audio data corresponding to the music to be played and the index data and the graphic data to be displayed, therein. Further, the RAM 34 stores the processing program concerning the function of the wrist audio player 3, the result of processing by various processing, and so on.

The ROM 42 is a semiconductor memory provided fixedly, for storing the system program corresponding to the wrist audio player 3 and various application programs corresponding to the system 1, or various control data and various display data. Further, the ROM 42 stores the system program, the play control data according to various play modes, the data on the typical tempo and the typical rhythm of music, specified by the genre data, and so on. And further, the ROM 42 stores a plurality of animations (refer to FIG. 13) and a plurality of frame animations (refer to FIG. 16), previously.

The MMC 35 comprises a register 351 in which a MMCID (a Manufacture ID, a Product ID, a Serial Number) is stored fixedly. Further, according to the MMC 35, the data transferred from the personal computer 2 is formatted in a data format shown in FIG. 5 and stored in the register 351.

Figure 5:
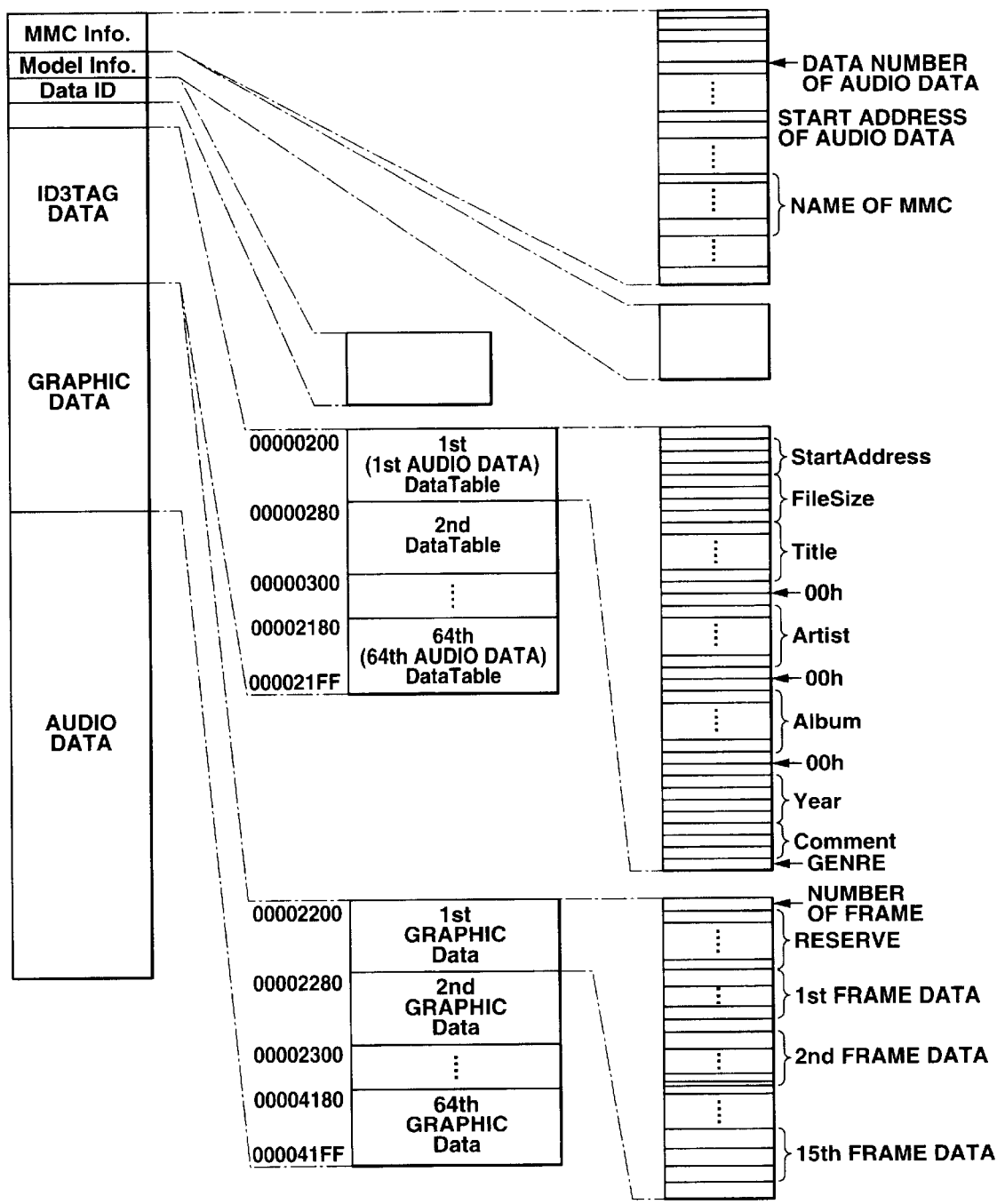
FIG. 5 is a view for explaining a data format stored in a MMC.

FIG. 5 is a view for explaining the data format of the data stored in the MMC 35.

As shown in FIG. 5, the MMC 35 comprises areas in which a "MMC Info.", a "Model Info.", a "Data ID", an "ID3TAG Data", a "Graphic Data" and an "Audio Data" are stored.

The "MMC Info." stores a data number of an audio data (1 byte), a start address of an audio data when the audio data is additionally written to the MMC 35 (2 bytes), a name of a MMC for distinguishing the MMC 35 (36 bytes) and so on, therein.

The "Model Info." stores a model number of a wrist audio player 3, whether the MMC 35 is formatted or not and so on, therein.

The "Data ID" stores a number data, for example, of 16 figures, generated by a random number of the personal computer 2 when the data is transferred from the personal computer 2.

The "ID3TAG Data" is an individual management data and an index data. The "ID3TAG Data" stores a start address (Start Address), a file size (File Size), a tune's name (Title), an artist's name (Artist), an album's name (Album), a year (Year), a comment (Comment), a genre (Genre) and so on, every audio data. The tune's name, the artist's name and the album's title forms the index data and displayed on the display unit 33 of the wrist audio player 3. The genre is 1 byte data for specifying such a characteristic as a tempo, a rhythm and so on of music.

FIG. 6 is a view showing a type of the genre. As shown in FIG. 6, various types of genres can be set, for example, as "0; 'Blues'", "1; 'Classic Rock'", "2; 'Country'", "3; 'Dance'" and so on.

The "Graphic Data" and the "Audio Data" are separated and stored into an individual area, respectively.

When "Graphic Data" stores a static picture image or a motion picture image therein, the compression ratio of the graphic data is a higher than one of the audio data.

That is, even in such a case of storing the audio data and the graphic data to be corresponded to each other, the audio data is collected together from only the audio data and stored in a predetermined area of the "Audio Data" and the graphic data is collected together from only the graphic data and stored in a predetermined area of the "Graphic Data", without compressing the audio data and the graphic data in the same compression ratio, storing the audio data and the graphic data one over the other, and connecting between the audio data and the graphic data.

Thereafter, the audio data and the graphic data are corresponded to each other by the start addresses thereof, and the start addresses are stored in the "ID3TAG Data".

That is, according to the embodiment of the present invention, specially, the dance animation that is a collection of illustrations is adopted as the motion picture image, and thereby the data amount of the graphic data is comparatively small. As a result, it is unnecessary that the graphic data is compressed in the MPEG system. On the other hand, if a static picture image having a high resolution or a motion picture image having a high resolution is adopted as the static picture image or the motion picture image, respectively, the compression ratio of the graphic data becomes lower corresponding to a quality of the audio data and the data amount of the graphic data can not be reduced. As a result, it will be impossible that the more audio data is stored.

However, the display area of the display unit 33 of the wrist audio player 3 is so small that it is unnecessary that a graphic data having a high resolution is displayed on the display unit 33. Further, if the compression ratio of the graphic data is lowered to attach importance to the quality of the display, the amount of the data is wasted so that it will be possible that more the audio data having a high quality is stored by raising the compression ratio.

Further, the start address of each audio data is designated on the ID3TAG data, and the start address of each graphic data is fixed, thereby the graphic data is read out in order of tune.

For example, each audio data and each graphic data are controlled as follows. In the case wherein the $1^{st}$ tune ($1^{st}$ audio data) is searched, at the same time that the start address "00000200" of the $1^{st}$ audio data stored in the ID3TAG data is searched, the start address "00002200" of the $1^{st}$ graphic data is searched automatically.

In the same way, in the case wherein the $2^{nd}$ tune is searched, at the same time as that the start address "00000280" of the $2^{nd}$ audio data stored in the ID3TAG data is searched, the start address "00002280" of the $2^{nd}$ graphic data is searched automatically.

Herein, the start address of each graphic data may be corresponded to and stored in the ID3TAG data corresponding to each audio data, and when each audio data is read out, the graphic data having the start address stored in the ID3TAG corresponding to the audio data, may be read out.

Accordingly, it is always unnecessary that each audio data and each graphic data are corresponded to each other in the state of 1 to 1. As a result, it is possible that the graphic data and the audio data are corresponded to each other in the state of 1 to the plural.

The decoder 36 comprises a decode circuit for decoding a data compressed and coded in a predetermined compression code system.

For example, in the case wherein the data stored in the MMC 35 is an audio data, the decoder 36 comprises an audio data decoder composed of a MP3 decoder. The audio data decoder decomposes the audio data coded into a frame every AAU (Audio Access Unit), extracts such a data as a frame header data and a bit division data and such a side data as a scale factor and so on, every frame, and inverse-quantizes the audio data decomposed on the basis of the scale factor and the bit division data extracted. Thereafter, the audio data decoder carries on a sub-band synthesis to the audio data, separates the audio data by a L/R, and outputs the audio data as a PCM (Pulse Code Modulation) output signal to a D/A converter 37.

Further, in the case wherein the data stored in the MMC 35 is a graphic data, the decoder 36 may comprise a graphic data decoder.

The D/A converter 37 converts the PCM output signal inputted from the decoder 36 to an analog signal by a D/A conversion processing and outputs the analog signal to the audio output unit 38.

The audio output unit 38 comprises earphones or headphones connected through the earphone connection connector part 3E thereto, a speaker contained in the head part 3A, or the like. The audio output unit 38 outputs the analog signal inputted from the D/A converter 37.

The I/F unit 39 is an interface for transmitting a data between the personal computer 2 and the wrist audio player 3 through the connection attachment 4. The I/F unit 39 transmits a data and a control signal transferred from the personal computer 2 to the CPU 31 and transmits a data outputted from the CPU 31 to the personal computer 2 through the connection attachment 4, in the state wherein a pin provided at the connection attachment 4 is inserted in the pin insert hole of the external apparatus connection connector part 3D.

The battery 40 is such a secondary battery, for example, as a lithium-ion battery, a battery using various hydrogen occluded metals, or the like. The battery 40 supplies a current to each unit of the wrist audio player 3.

The connection attachment 4 is an interface for connecting between the personal computer 2 and the wrist audio player 3. The connection attachment 4 transmits a data to be sent and received between the personal computer 2 and the wrist audio player 3.

The connection attachment 4 may be connected to the personal computer 2 through a serial or parallel cable 5 as shown in FIG. 1. Further, the connection attachment 4 may contain a wireless communication function using an infrared rays, an electromagnetic induction, an extremely feeble ratio wave or the like, thereby may wireless communicate to the personal computer 2 having a wireless communication function like one of the connection attachment 4. Therefore, the connection attachment 4 may transfer the data between the personal computer 2 and the wrist audio player 3.

Further, the connection attachment 4 may be composed so as to be able to switch the interface to be used, to provide for an interface extension.

And further, the connection attachment 4 comprises a pin for connecting to the external apparatus connection connector part 3D of the wrist audio player 3 so that the pin can be installed in and taken away the external apparatus connection connector part 3D. When the connection attachment 4 is connected to the writ audio player 3, the pin of the connection attachment 4 is inserted into the input terminal (pin insert hole) provided at the external apparatus connection connector part 3D of the wrist audio player 3, thereby the pin is continued to an electronic circuit board provided at an internal of the head part 3A of the wrist audio player 3.

Next, a processing operation by the application program will be explained as follows.

First, the flow of the processing carried on by the personal computer 2 will be explained with reference to FIGS. 7 to 11.

Figure 8:
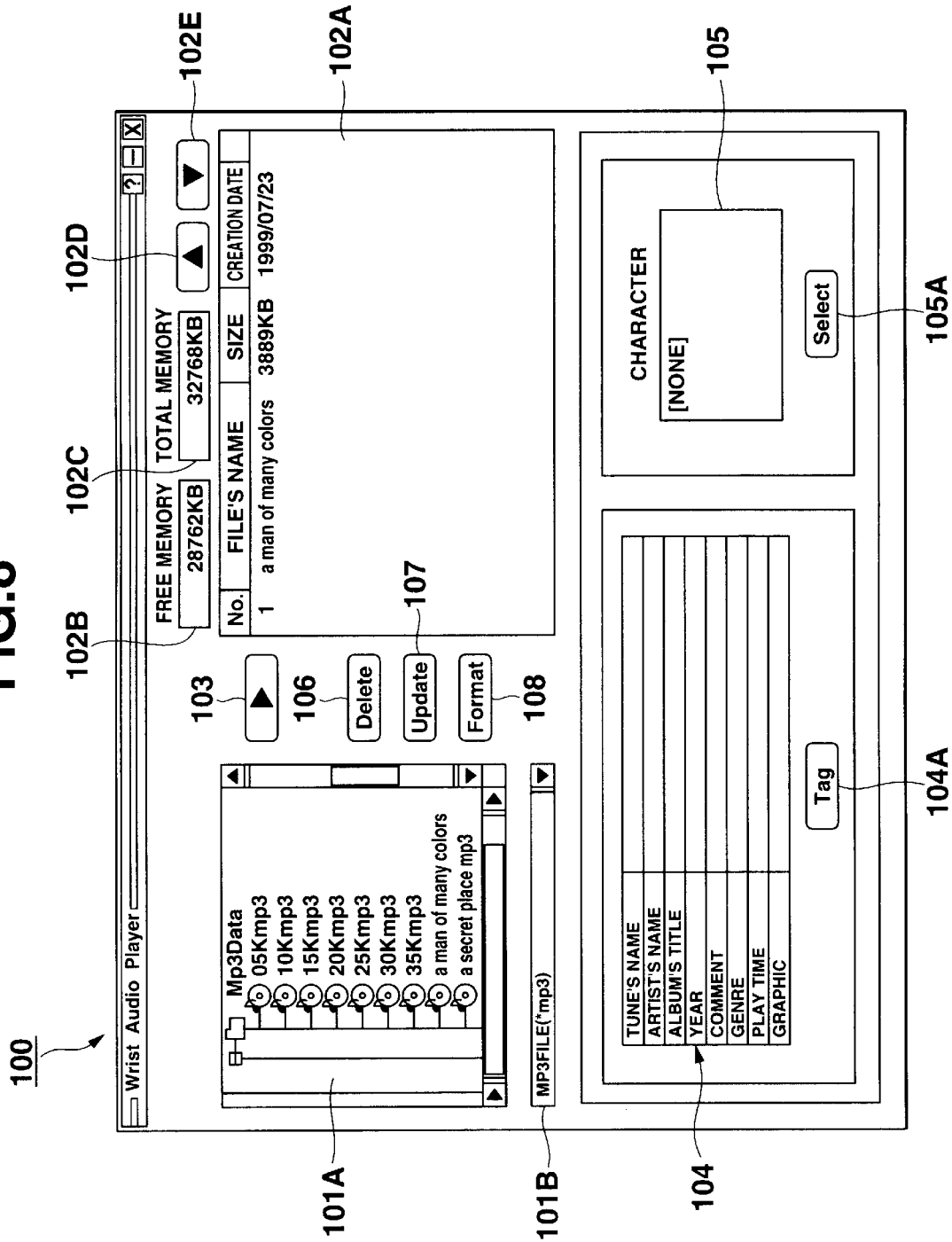
FIG. 8 is a view showing an example of a main dialog subwindow 100 displayed on a display 23 of the personal computer 2.

FIG. 7 is a flowchart for explaining a flow of a data transfer between the personal computer 2 and the wrist audio player 3. FIG. 8 is a view showing an example of a main dialog subwindow 100 displayed on the display unit 23 of the personal computer 2.

FIG. 9 is a flowchart for explaining a graphic data creating and editing processing carried on by the personal computer 2. FIG. 10 is a view showing an example of an editor dialog subwindow 200 displayed on the display unit 23 of the personal computer 2.

Figure 11:
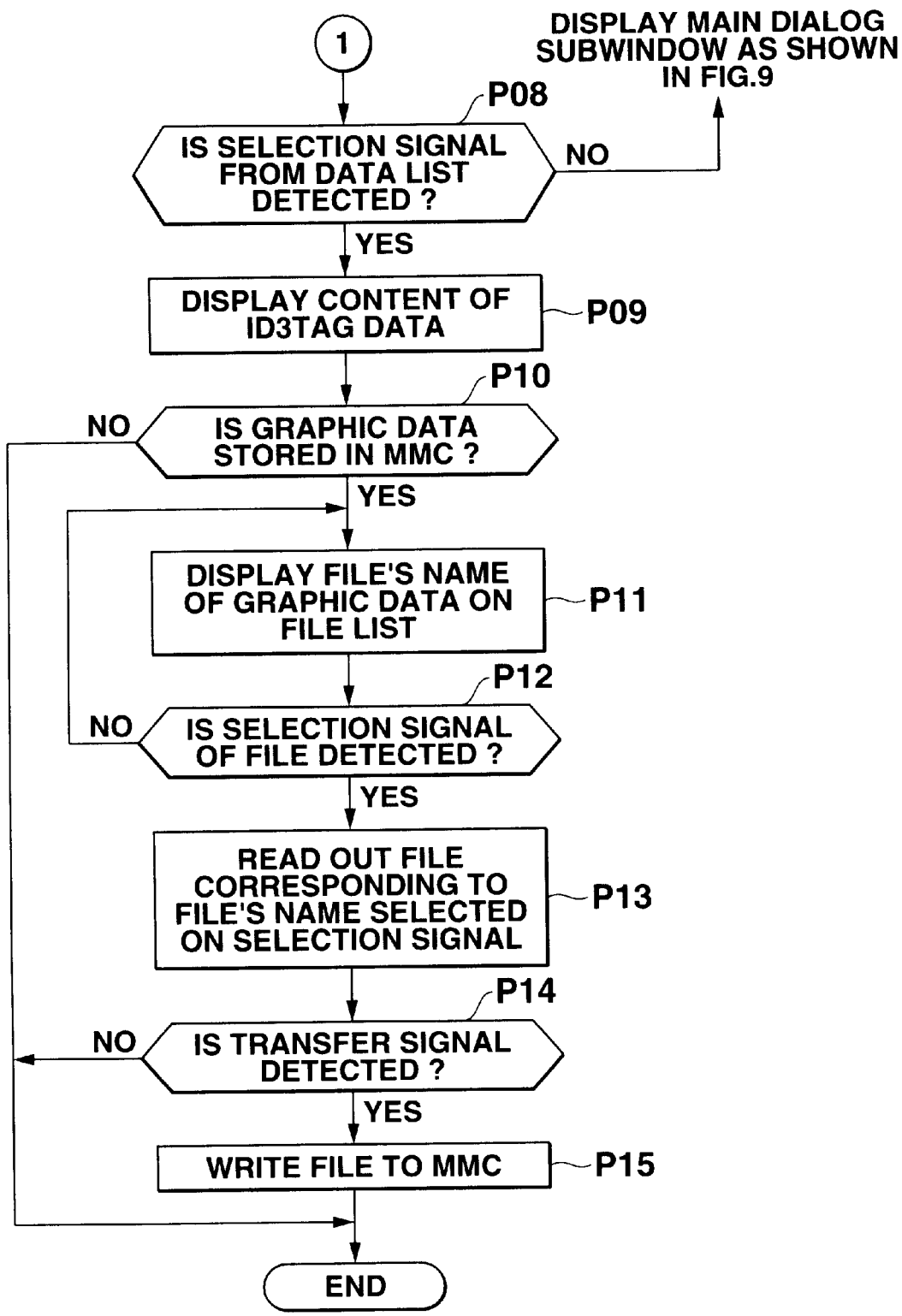
FIG. 11 is a flowchart for explaining a data storage processing carried on by the personal computer 2.

FIG. 11 is a flowchart for explaining a data storage processing carried on by the personal computer 2.

Herein, the program to realize each function described at the flowcharts stores in the form of a computer-readable program code, in the storage medium 26 of the personal computer 2. Therefore, the CPU 21 can carry on each function one after another, according to the computer-readable program code.

Further, the CPU 21 can carry on each function one after another, according to the computer-readable program code transmitted through a data signal from an external.

That is, it is possible that the CPU 21 carries on a unique function of the embodiment of the present invention, by using a program and a data stored in the storage medium 26 and also transmitted through a data signal from an external.

First, the data transfer will be explained with reference to FIGS. 7 and 8.

The personal computer 2 and the wrist audio player 3 are connected through the connection attachment 4, as shown in FIG. 1.

According to the personal computer 2 side, the CPU 21 reads the application program on the data transfer out of the storage medium 26, expands it in the RAM 23, and starts carrying on it according to an instruction inputted by an user.

According to the wrist audio player 3 side, the CPU 31 waits for receiving a control signal transmitted from the personal computer 2 (Step M1; NO).

According to the personal computer 2 side, when the instruction for starting carrying on the application is inputted by the user, the CPU 21 reads various data, for example, an ID data, a plurality of audio data (MP3 data), a plurality of graphic data (a dot pattern, a dance animation, and an image), and ID3TAG data, out of the storage medium 26 (Step P01). Thereafter, the CPU 21 instructs the display unit 23 to display the main dialog subwindow 100 as shown in FIG. 8, thereon (Step P02).

FIG. 8 is an example of the main dialog subwindow 100.

The main dialog subwindow 100 comprises a data list subwindow 101A and a file extension select subwindow 101B, of the side of the personal computer 2 at the left upper side thereof.

Further, the main dialog subwindow 100 comprises a data list subwindow 102A, a MMC free memory display subwindow 102B, a MMC total memory display subwindow 102C and a tune order re-arrange buttons 102D and 102E, of the side of the wrist audio player 3 at the right upper side thereof.

Further, the main dialog subwindow 100 comprises a transfer button 103, a delete button 106, an update button 107 and a format button 108 between the left upper side and the right upper side thereof.

Further, the main dialog subwindow 100 comprises a TAG data list subwindow 104 and a TAG button 104A at the left lower side thereof. Further, the main dialog subwindow 100 comprises a file list subwindow 105 and a select button 105A at the right lower side thereof.

According to the side of the personal computer 2, the data list subwindow 101A is an area wherein the audio data file stored in the audio data file storage area 26B of the personal computer 2, is displayed as a list.

The file extension select subwindow 101B is an area wherein the file extension is displayed. When a predetermined file extension is selected on the file extension select subwindow 101B, only the audio data files having the file extension selected may be extracted from the audio data files displayed on the data list subwindow 101A and displayed on the data list subwindow 101A.

According to the side of the wrist audio player 3, the data list subwindow 102A is an area wherein the audio data file stored in the MMC 35 of the wrist audio player 3, is displayed with a size thereof and a creation date thereof, as a list.

The MMC free memory display subwindow 102B is an area wherein the free memory of the MMC 35 is displayed.

The MMC total memory display subwindow 102C is an area wherein the total memory of the MMC 35 is displayed.

The tune order re-arrange buttons 102D and 102E are operated to re-arrange a storage order of the audio data, that is, a tune order stored in the MMC 35.

The transfer button 103 is operated to transfer a data from the personal computer 2 to the wrist audio player 3 and store the data in the wrist audio player 3.

The delete button 106 is operated to delete the data of the MMC 35.

The update button 107 is operated to write the audio data and the graphic data not to be transferred, to the wrist audio player 3.

The format button 108 is operated to format the MMC 35.

The TAG data list subwindow 104 is an area wherein the detailed data about the audio data selected from the data list subwindow 102A at the side of the wrist audio player 3 and the data list subwindow 101A at the side of the personal computer 2, is displayed.

When the audio data is selected from the data list subwindow 102A at the side of the wrist audio player 3, the display item on the TAG data list subwindow 104 includes "Tune's name", "Artist's name", "Album's title", "Year", "Comment", "Genre", "Play time", "Graphic" and so on.

When the audio data is selected from the data list subwindow 101A at the side of the personal computer 2, the display item on the TAG data list subwindow 103 includes "Frame number", "Bit rate", "Sampling rate", "Channel mode", "File size", "Data size" and so on.

The file list subwindow 105 is an area wherein each file's name of the graphic data is displayed as a list, in the case wherein the graphic data is stored in the MMC 35.

When the file's name to be created and edited is selected from the file's names displayed as a list on the file list subwindow 105, by the select button 105A, the graphic data file corresponding to the file selected is read out of the graphic data file storage area 26C.

Thereafter, according to the graphic data creating and editing processing, the graphic data is edited and the graphic data edited is written to the wrist audio player 3 according to a storage instruction.

Further, a "NONE" which means that any graphic data is not stored in the MMC 35, is displayed on the file list subwindow 105, in the case wherein any graphic data is not stored in the MMC 35.

At the step P02 in FIG. 7, according to the personal computer 2, the CPU 21 reads the file's name out of the storage medium 26 and instructs the display unit 23 to display the list of the file's name on the data list subwindow 101A of the side of the personal computer 2.

At this step, any data is not displayed on the data list subwindow 102A of the side of the wrist audio player 3.

Thereafter, according to the personal computer 2 side, the CPU 21 carries on an authentication processing (Step P03). During the authentication processing, the CPU 21 transmits various types of the control signal to the wrist audio player 3 side.

According to the wrist audio player 3 side, when the CPU 31 detects various types of the control signal (Step M1; YES), the CPU 31 writes the data to or reads the data out of the MMC 35 according to the content of the control signal (Step M2). Thereafter, the CPU 31 transmits the data read out of the MMC 35 and the writing stop signal to the personal computer 2 side.

Various types of the control signal includes a reading request signal of the MMCID and the data ID, a reading request signal of a data related to the MMCID and the data ID, a MMC format request signal, a writing request signal of a data transferred, and so on.

According to the authentication processing, the CPU 21 compares the MMCID stored in the personal computer 2 side with the MMCID read out of the wrist audio player 3.

In the case wherein the both MMCID agrees with each other, continuously, the CPU 21 compares the data ID stored in the personal computer 2 side with the data ID read out of the wrist audio player 3.

In the case wherein the both data ID agrees with each other, the CPU 21 judges that the authentication proves successful (Step P04; YES).

When the CPU 21 judges that the authentication proves successful, it is possible that the data is transferred between the personal computer 2 and the wrist audio player 3, interactively. Therefore, the CPU 21 reads out the ID3TAG data of the audio data stored in the wrist audio player 3 and instructs the data list subwindow 102A or the TAG data list subwindow 104 to display the ID3TAG data thereon.

Therefore, according to the application program, the CPU 21 can carry on various processing on the personal computer 2.

For example, in this state, when the select button 105A is operated on the main dialog subwindow 100, to output the selection signal, the CPU 12 carries on the graphic data creating and editing processing for creating the graphic, storing the graphic created in the MMC 35, and editing and deleting a plurality of graphic data stored previously, on the basis of the selection signal (Step P05 to Step P501 in FIG. 9).

Further, when the transfer button 103, the update button 107, the delete button 107, the format button 108 and so on are operated on the main dialog subwindow 100, to output the transfer signal and so on and the CPU 12 detects the transfer signal (Step P06; YES), the CPU 21 transmits the control signal to the writ audio player 3 on the basis of the transfer signal.

According to the wrist audio player 3 side, the CPU 31 carries on various processing of writing the data to the MMC 35, reading the data out of the MMC 35, formatting the MMC 35 and so on, according to the content of the control signal.

Thereafter, according to the personal computer 2, the CPU 21 returns to the processing at the step P02.

When a predetermined audio data is selected from the data list subwindow 102A at the wrist audio player 3 side, on the main dialog subwindow 100 displayed on the display unit 23 (Step P501; NO in FIG. 9 to Step P08; YES in FIG. 11), the CPU 21 carries on the data storage processing (Steps P09 to P15 in FIG. 11), and transmits the reading request signal of the ID3TAG data to the wrist audio player 3.

Thereafter, according to the wrist audio player 3, the CPU 31 transfers the ID3TAG data stored in the MMC 35 to the personal computer 2, on the basis of the request signal.

And thereafter, the CPU 21 instructs the display unit 23 to display one of the ID3TAG data corresponding to each audio data transferred from the wrist audio player 3 on the data list subwindow 102A at the side of the wrist audio player 3. When the graphic data is stored in the MMC 35, the CPU 21 instructs the display unit 23 to display the name of the graphic data (file's name) on the file list subwindow 105.

On the other hand, when the CPU 21 judges that the authentication does not prove successful (Step P04; NO), the CPU 21 instructs the display unit 23 to display an error message thereon (Step P07). Thereafter, the CPU 21 returns to the processing at the step P02, for displaying the main dialog subwindow 100.

Next, the a graphic data creating and editing processing will be explained with reference to FIGS. 9 and 10.

When the select button 105A is operated on the main dialog subwindow 100 to output the selection signal, and the CPU 21 detects the selection signal (Step P501; YES), the CPU 21 instructs the display unit 23 to display the editor dialog subwindow 200 that is a crating and editing display as shown in FIG. 10, thereon (Step P502).

FIG. 10 is an example of the editor dialog subwindow 200.

The editor dialog subwindow 200 comprises a menu bar 212 at an upper section thereof.

Further, the editor dialog subwindow 200 comprises a tool box 201 at a left side, a pattern editing area 202, a register button 203, an edit button 204, a delete button 205 right next to the tool box 201, a preview area 206, a preview button 207, and a stop button 208 right next to the buttons 203 to 205, under the menu bar 212.

Further, the editor dialog subwindow 200 comprises a creation pattern subwindow 209 having a size of 5 frames by 3 under the pattern editing area 202, the preview area 206 and so on, and a cancel button 210 and a save button 211 under the creation pattern subwindow 209.

The menu bar 212 is a bar wherein such a menu as "File", "Edit" and "Help" is displayed.

The tool box 201 is a box wherein a plurality of tool icons necessary when editing a graphic data, showing a pen, an eraser, a selection of color, a line, a square, an undoing and so on, are displayed.

The pattern editing area 202 is an area wherein a dot pattern (an illustration) selected from the frames of the dance animation displayed on the creation pattern subwindow 209 is enlarged and displayed.

The register button 203 is operated to register and display the dot pattern (the illustration) displayed on the pattern editing area 202, on the creation pattern subwindow 209, after the dot pattern is processed by the creating and editing processing.

The edit button 204 is operated to display and edit the dot pattern voluntarily selected from the dot patterns displayed on the creation pattern subwindow 209, on the pattern editing area 202.

The delete button 205 is operated to delete the dot pattern selected on the creation pattern subwindow 209.

The preview area 206 is an area wherein the dot pattern of each frame displayed on the creation pattern subwindow 209 is displayed continuously.

The preview button 207 is operated to start displaying the dance animation.

The stop button 208 is operated to stop displaying the dance animation started by the preview button 207.

The creation pattern subwindow 209 is a window wherein the dot pattern of each frame is displayed continuously.

The dot pattern of each frame of the dance animation stored in the graphic data file selected from the file list subwindow 105 of the main dialog subwindow 100, is displayed on the display frames 209A, 209B and so on of the creation pattern subwindow 209, in order.

Any display frame is selected from the display frames of the creation pattern subwindow 209 by a mouse or the like, and thereby it is possible that the dot pattern to be edited is selected.

As shown in FIG. 9, according to the personal computer 2, when the CPU 21 detects the selection signal of the file outputted by operating the "File" menu of the menu bar 212 on the editor dialog 200 shown in FIG. 10 (Step P503; YES), the CPU 21 reads the file selected on the selection signal out of the graphic data storage are 26C of the storage medium 26 (Step P504). Thereafter, the CPU 21 instructs each of the display frames 209A, 209B, 209C and so on of the creation pattern subwindow 209 to display each dot pattern of the file read out, thereon (Step P505).

The each dot pattern displayed on each display frame of the creation pattern subwindow 209 shown in FIG. 10 is an example of the dance animation wherein a person dances a "TWIST".

Thereafter, when the a predetermined dot pattern is selected from the dot patterns displayed on the display frames of the creation pattern subwindow 209 and the edit button 204 is operated, the CPU 21 instructs the pattern editing area 202 to display the dot pattern selected thereon.

Thereafter, when the dot pattern is edited by using the tool icons of the tool box 201 (Step P506), the CPU 21 instructs the pattern editing area 202 to display the result of editing the dot pattern on occasion (Step P507).

And After, when the CPU 21 detects the overwrite signal outputted by operating the "File" menu of the menu bar 212 (Step P508; YES), the CPU 21 updates and stores the dot pattern as the content of the file read out at the step P505 (Step P509).

On the other hand, when the CPU does not detect the overwrite signal (Step P508; NO), the CPU 21 receives an input of a new file's name to be stored the dot pattern and stores the dot pattern as a content of a new file having the name file's name inputted (Step P514).

Thereafter, the CPU 21 returns to the processing at the step P502.

According to the step P503, when the CPU 21 does not detect the selection signal of the file outputted by operating the "File" menu of the menu bar 212 on the editor dialog 200 (Step P503; NO) and the CPU 12 detects a new creation signal for creating a new file (Step P510; YES), the CPU 21 starts creating and editing a new dot pattern at the pattern creating area 202.

Thereafter, the CPU 21 creates and edits the dot pattern on the editing operation of using the tool icons of the tool box 201 (Step P511). And the CPU 21 instructs the pattern editing area 202 to display the result of editing the dot pattern as occasion (Step P512).

And After, when the CPU 21 detects the saving signal outputted by operating the "File" menu of the menu bar 212 (Step P513; YES), the CPU 21 receives an input of a new file's name to be stored the dot pattern and stores the dot pattern as a content of a new file having the file's name inputted (Step P514).

Thereafter, the CPU 21 returns to the processing at the step P502.

According to the step P507 or P512 wherein the result of editing is displayed, the CPU 21 may preview the dance animation as shown at the steps P515 to P516.

That is, when the CPU 21 detects the preview signal outputted by operating the preview button 207 (Step P515: YES), the CPU 21 instructs the preview display 206 to continuously preview the dot patterns displayed at the creation pattern subwindow 209, one after another (Step P516).

Herein, the speed of preview is, for example, 62.5 ms or 31.25 ms.

On the other hand, when the CPU 21 detects the stop signal outputted by operating the stop button 208, the CPU 21 stops previewing the dance animation.

According to the step P501, when the CPU 21 does not detect the selection signal for displaying the editor dialog subwindow 200 (Step P501; No), the CPU 21 starts the data storage processing shown in FIG. 11.

Next, the data storage processing will be explained with reference to FIG. 11.

When the CPU 21 detects a selection signal for selecting a predetermined audio data from the data list subwindow 102A at the side of the wrist audio player 3 on the main dialog subwindow 100 shown in FIG. 8 (Step P08; YES), the CPU 21 requires the wrist audio player 3 to transmit the ID3TAG data on the audio data selected on the selection signal.

Thereafter, the CPU 21 instructs the TAG data list subwindow 104 to display the content of the ID3TAG data transmitted from the wrist audio player 3, thereon (Step P09).

On the other hand, the CPU 21 does not detect the selection signal (Step P08; NO), the CPU 21 instructs the display unit 23 to display the main dialog subwindow 100 thereon, as shown in FIG. 9.

Further, the CPU 21 judges whether the graphic data, for example, the dance animation is stored in the MMC 35 of the wrist audio player 3 or not (Step P10).

When the CPU 21 judges that the graphic data is not stored in the MMC 35 of the wrist audio player 3 (Step P10; NO), the CPU 21 finishes the data storage processing as it is.

On the other hand, the CPU 21 judges that the graphic data is stored in the MMC 35 of the wrist audio player 3 (Step P10; YES), the CPU 21 instructs the file list subwindow 105 to display the file's name of the graphic data thereon (Step P11).

Thereafter, when the CPU 21 detects the selection signal for selecting the file from one displayed on the file list subwindow 105 (Step P12; YES), the CPU 21 reads the file of the graphic data, corresponding to the file's name selected on the selection signal out of the graphic data file storage are 26C of the personal computer (Step P13).

And further, when the CPU 21 detects the transfer signal outputted by operating the transfer button 103 (Step P14; YES), the CPU 21 writes the file of the graphic data read out, to the MMC 35 of the wrist audio player 3 (Step P15).

According to the side of the wrist audio player 3, the CPU 31 writes the data to the MMC 35, according to the data writing request signal transmitted from the personal computer 2.

According to the processing as described above, it is possible that the CPU 31 changes the content of the graphic data stored in the MMC 35 at the side of the wrist audio player 3 to the data of the graphic data, for example, the dance animation created by the personal computer 2.

When the graphic data is transferred from the personal computer 2 to the wrist audio player 3, according to the personal computer 2, the CPU 21 transmits the following control signal to the wrist audio player 3. The control signal controls the wrist audio player 3 so that the graphic data transferred from the personal computer 2 is stored to the graphic data storage area separated from the audio data storage area and provided in the MMC 35, wherein the graphic data storage area and the audio data storage area are corresponded to each other by the address.

According to the wrist audio player 3, the CPU 31 writes the graphic data transferred from the personal computer 2 to the MMC 35, according to the control signal as described above.

Further, the personal computer 2 may be composed so as to transfer the audio data file and the graphic data file selected at the same time to the wrist audio player 3, and the wrist audio player 3 may be composed so as to store the audio data file and the graphic data file transferred from the personal computer 2 in the MMC 35.

In this case as described above, according to the wrist audio player 3, the audio data file and the graphic data file are separated into and stored in each individual storage area of the MMC 35, respectively. Thereafter, the data format shown in FIG. 5 is created, wherein the audio data file and the graphic data are corresponded to each other by the addresses. And after, the data format is written to the MMC 35.

And further, the personal computer 2 may be composed so as to transfer the audio data file and the graphic data file corresponded to each other by the address, every block composed thereof to the writ audio player 3, and the wrist audio player 3 may be composed so as to write the audio data file and the graphic data transferred every block to the MMC 35.

According to the step P12, when the CPU 21 does not detect the selection signal for selecting the file from one displayed on the file list subwindow 105 (Step P12; NO), the CPU 21 returns to the processing at the step P11 and waits for receiving the input of the selection signal of the file on the file list subwindow 105.

According to the step P14, when the CPU 21 does not detect the transfer signal outputted by operating the transfer button 103 (Step P14; NO), the CPU 21 finishes the data storage processing.

Next, the flow of the play processing carried on by the wrist audio player 3 will be explained with reference to FIGS. 12 to 15.

FIG. 12 is a flowchart for explaining the play processing carried on by the wrist audio player 3.

Figures 13A, 13B, 13C:
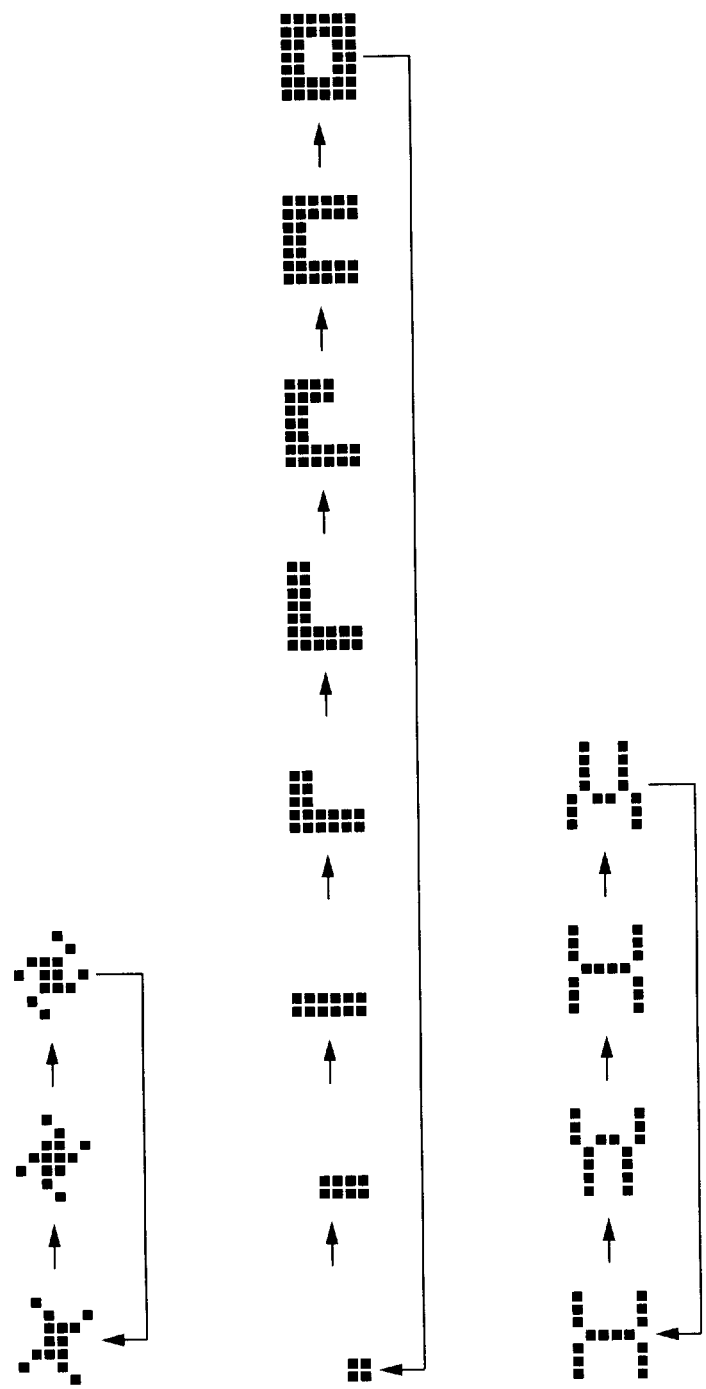
FIGS. 13A, 13B and 13C are views showing an example of a graphic (animation) displayed on display areas 33B and 33C of a display unit 33 of the wrist audio player 3.

FIGS. 13A, 13B and 13C are views showing an example of an illustration and an animation shown on the display areas 33B and 33C of the display unit 33 of the wrist audio player 3.

Figure 14:
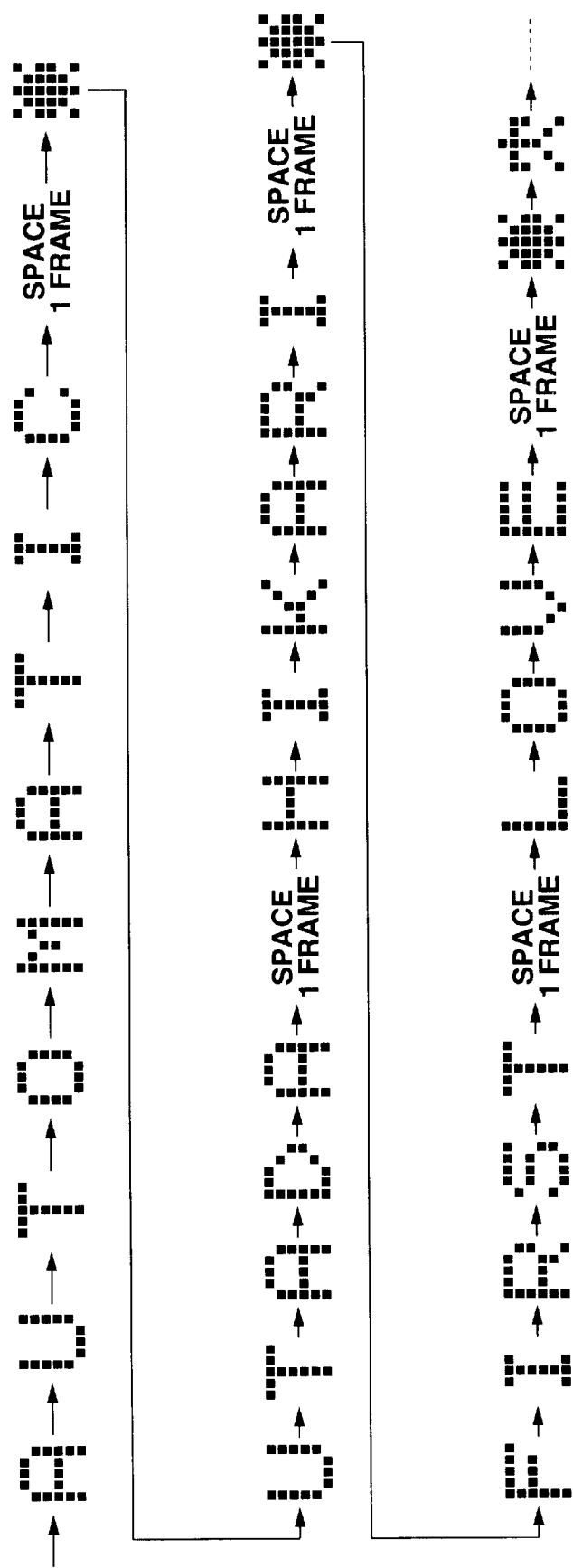
FIG. 14 is a view showing an example of an ID3TAG data (index) displayed on the display area 33B of the display unit 33 of the wrist audio player 3.

FIG. 14 is a view showing an example of the ID3TAG (index) shown on the display area 33B of the display unit 33 of the wrist audio player 3.

Figures 15A, 15B:
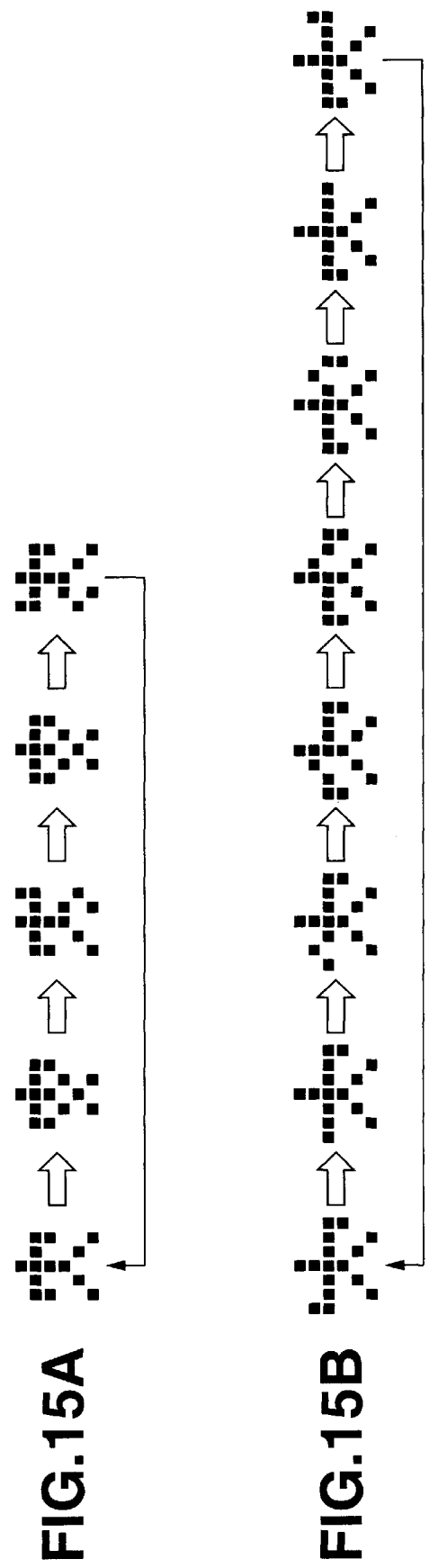
FIGS. 15A and 15B are views showing an example of a dance animation as an example of the graphic displayed on the display area 33B of the display unit 33 of the wrist audio player 3.
Figure 16D:
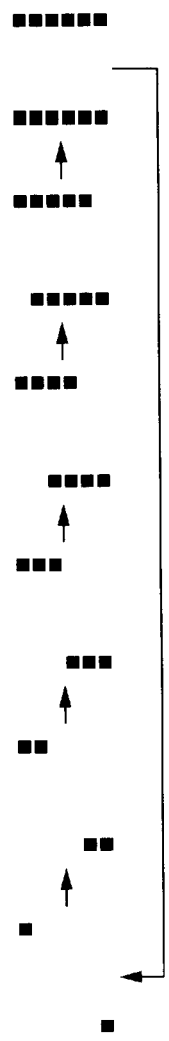
FIGS. 16A to 16E are views showing an example of a frame animation as an example of the graphic displayed on the display area 33C of the display unit 33 of the wrist audio player 3.
Figure 16E:
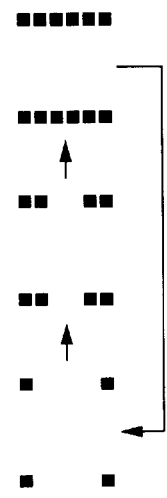
Figure 16A:
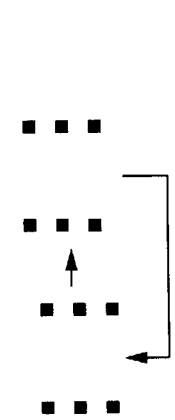
Figure 16B:
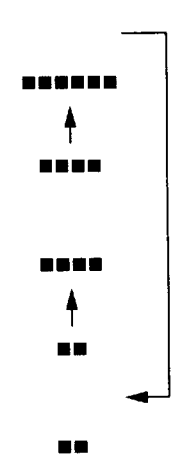
Figure 16C:
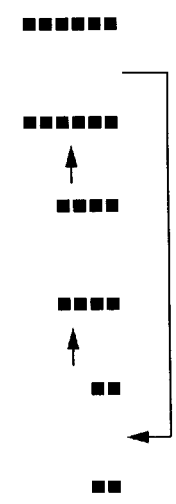

FIGS. 15A and 15B are views showing an example of the dance animation as an example of the graphic displayed on the display area 33B of the display unit 33 of the wrist audio player 3.

Herein, the program to realize each function described in the flowchart is stored in the ROM 42 of the wrist audio player 3, in the form of the computer-readable program code. Thereby, the CPU 31 carries on each function one after another, according to the program code.

As shown in FIG. 12, when the play mode is set up by operating the mode button 32A, the CPU 31 reads all the ID3TAG data that is a tune's name, an artist's name, an album' title, a track number and a play time, out of the MMC 35, and stores the ID3TAG data in the RAM 34 temporarily (Step S01).

Thereafter, the CPU 31 searches the ID3TAG data of the $1^{st}$ audio data from the RAM 34. When the CPU 31 can search the ID3TAG data from the RAM 34, the CPU 31 reads it out of the RAM 34. At the same time, the CPU 31 searches the graphic data for example, of the dance animation, of the $1^{st}$ audio data from the MMC 35. When the CPU 31 can search the graphic data from the MMC 35, the CPU 31 reads it out of the MMC 35 (Step S02).

On the other hand, when the CPU 31 cannot search both the ID3TAG data and the graphic data from the RAM 34 and the MMC 35, respectively, the CPU 31 selects and reads any one of 3 patterns of animations stored in the ROM 42, shown in FIGS. 13A to 13C, respectively, at random.

Thereafter, the CPU 31 instructs the display area 33B to display the index data composed of a tune's name, an artist's name and an album's title one character after another character, thereon. One example of the display area 33B is shown in FIG. 14.

As shown in FIG. 14, for example, a tune's name "AUTOMATIC" is displayed one character after another character so that "A", "U", "T" and so on are orderly displayed per character. Then, one frame is spaced and a predetermined graphic data is displayed.

Thereafter, like the tune's name, an artist's name "UTAH HIKARI" is displayed one character after another. Then, one frame is spaced and a predetermined graphic data is displayed.

And after, an album's title "FIRST LOVE" is displayed one character after another character. Then, one frame is spaced. Continuously, the CPU 31 instructs the display area 33B to display each dot pattern of the dance animation as shown in FIGS. 15A and 15B, in order, thereon (Step S03).

FIGS. 15A and 15B show an example of the dance animation. The dance animation shown in FIG. 15A illustrates "TWIST" and the dance animation shown in FIG. 15B illustrates "WAVE".

As show in FIGS. 15A and 15B, the illustrations of "TWIST" composed of a total of 5 frames and the illustrations of "WAVE" composed of a total of 8 frames, the frame formed from dot patterns, are continuously shown one frame after another frame, respectively.

Further, a user may create a dance animation on the personal computer 2 and the dance animation may be displayed on the wrist audio player 3.

As shown in FIG. 12, when the CPU 31 detects a tune selection signal outputted by operating the play operation button 32C (Step S04; YES), the CPU 31 searches the ID3TAG data of the audio data selected on the tune selection signal from the RAM 34. When the CPU 31 can search the ID3TAG data from the RAM 34, the CPU 31 reads it out of the RAM 34. At the same time, the CPU 31 searches the graphic data of the audio data from the MMC 35. When the CPU 31 can search the graphic data from the MMC 35, the CPU 31 reads it out of the MMC 35 (Step S06).

Thereafter, when the CPU 31 detects a playing method selection signal outputted by operating the mode button 32A (Step S07; YES), the CPU 31 reads a play control data of the playing method selected on the playing method selection signal out of the ROM 42. And after, the CPU 31 plays music on the basis of the play control data. The playing method includes the "Sequential play" as a normal method, the "Shuffle", the "All tune loop", the "Shuffle loop", the "One tune loop", the "Part loop", the "EQ set up" and so on.

On the other hand, when the CPU 31 does not detect the playing method selection signal because the mode button 32A is not operated and the playing method is not changed (Step S07; NO), the CPU 31 carries on the "Sequential play".

When the CPU 31 detects the play signal outputted by operating the play operation button 32C (Step S08; YES), the CPU 31 searches the start address of the audio data selected on the tune selection signal, from the MMC 35, and reads the audio data out of the MMC 35. Thereafter, the CPU 31 transfers the audio data read out of the MMC 35, to the RAM 34, and outputs the audio data transferred to the RAM 34, to the decoder 36.

Thereafter, when the decoder 36 carries on the extension processing of the audio data outputted from the RAM 34 and extends the audio data to the PCM signal, the CPU 31 outputs the PCM signal from the decoder 36 to the D/A converter 37.

And after, when the D/A converter 37 converts the PCM signal from a digital signal to an analog signal, the CPU 31 outputs the analog signal from the D/A converter 37 to the audio output unit 38.

While the audio output unit 38 plays music, the CPU 31 instructs the display area 33B to display the index data composed of the tune's name, the artist's name and the album's title of the audio data selected on the tune selection signal and the graphic data composed of the dance animation, in the order of the tune's name, the artist's name, the album's title and the dance animation, thereon.

Figure 17:
FIG. 17 is a view showing an example combined the ID3TAG data displayed on the display area 33B with the graphic equalizer patter displayed on the display area 33C, as an example of the graphic displayed on the display unit 33 of the wrist audio player 3.

Further, when the graphic equalizer pattern is stored in the ROM 42, the CPU 31 selects the graphic equalizer pattern at random and instructs the display area 33C to display it thereon, as shown in FIG. 17.

When the index data and the graphic data and the graphic equalizer pattern are displayed on the display area 33B and the display area 33C, respectively, the CPU 31 detects the "Genre" from the ID3TAG data and controls the display speed of the dance animation to the tempo and the rhythm according to the "Genre".

Further, the time of day control unit 41 may measure the tempo of the audio data, and thereby the CPU 31 may control the display speed of the dance animation according to the tempo.

And further, the time of day control unit 41 counts the play time of the music, so that the CPU 31 instructs the display area 33A to display the play time and the track number thereon (Step S09).

Thereafter, the CPU 31 reads out the frame animation selected at random, and instructs the display area 33C to display the frame animation to the timing of the change of the display of the index data and the dance animation, thereon, as shown in FIGS. 16A to 16E.

And after, the CPU 31 continuously carries on the play of music, the display of the ID3TAG data and the dance animation, the display of the play time, and the display of the graphic equalizer patter, in order according to the playing method. When the CPU 31 detects the stop signal outputted by operating the play operation button 32C, the CPU 31 finishes the play of music and the display of the index data and the dance animation.

At the step S07, when the "Shuffle" is selected as a playing method, by operating the mode button 32A, the CPU 31 reads a shuffle tune selection control data out of the ROM 42 (Step S11), and instructs the display unit 33 to light on a "Shuffle" segment (Step S12).

Thereafter, when the CPU 31 detects the play signal outputted by operation the play operation button 32C (Step S13; YES), the CPU 31 carries on the play of music and the display of the index data and the dance animation according to the playing method on the basis of the shuffle tune selection control data, like the processing at the step S09 as described above.

At the step S07, when the "All tune loop" is selected as a playing method, by operating the mode button 32A, the CPU 31 reads an order all tune loop play control data out of the ROM 42 (Step S14), and instructs the display unit 33 to light on a "Loop" segment (Step S15).

Thereafter, when the CPU 31 detects the play signal outputted by operation the play operation button 32C (Step S16; YES), the CPU 31 carries on the play of music and the display of the index data and the dance animation according to the playing method on the basis of the order all tune loop play control data, like the processing at the step S09 as described above.

At the step S07, when the "Shuffle loop" is selected as a playing method, by operating the mode button 32A, the CPU 31 reads a shuffle all tune loop play control data out of the ROM 42 (Step S17), and instructs the display unit 33 to light on "Shuffle" and "Loop" segments (Step S18).

Thereafter, when the CPU 31 detects the play signal outputted by operation the play operation button 32C (Step S16; YES), the CPU 31 carries on the play of music and the display of the index data and the dance animation according to the playing method on the basis of the shuffle all tune loop play control data, like the processing at the step S09 as described above.

At the step S07, when the "One tune loop" is selected as a playing method, by operating the mode button 32A, the CPU 31 reads an one tune loop play control data out of the ROM 42 (Step S20), and instructs the display unit 33 to light on "1" and "Loop" segments (Step S21).

Thereafter, when the CPU 31 detects the play signal outputted by operation the play operation button 32C (Step S22; YES), the CPU 31 carries on the play of music and the display of the index data and the dance animation according to the playing method on the basis of the one tune loop play control data, like the processing at the step S09 as described above.

At the step S07, when the "Part loop" is selected as a playing method, by operating the mode button 32A, the CPU 31 reads a part loop play control data out of the ROM 42 (Step S23), and instructs the display unit 33 to light on "P" and "Loop" segments (Step S24).

Thereafter, when the CPU 31 detects the play signal outputted by operation the play operation button 32C (Step S25; YES), the CPU 31 carries on the play of music and the display of the index data and the dance animation according to the playing method on the basis of the part loop play control data, like the processing at the step S09 as described above.

At the step S07, when the "EQ set up" is selected as a playing method, by operating the mode button 32A, the CPU 31 reads a default data (dot pattern) of a plurality of EQ (equalizer) patterns out of the ROM 42 and transfers it to the RAM 34 (Step S26).

Thereafter, the CPU 31 detects a selection decision signal outputted by selecting and deciding a predetermined EQ pattern from a plurality of EQ patterns (Step S27; YES), the CPU 31 reads the dot pattern of the EQ pattern selected on the selection decision signal out of the RAM 34 (Step S28). The dot pattern of the EQ pattern is a pattern, for example, wherein an output sound pressure of each sound range of a high-pitched sound, a low-pitched sound and so on, is shown in a bar graph.

And after, when the CPU 31 detects the play signal outputted by operation the play operation button 32C (Step S29; YES), the CPU 31 plays music and instructs the display area 33B to display the EQ pattern in order, thereon.

The processing of playing music on the basis of the audio data selected on the tune selection signal is the same as one at the step S09, so that it is omitted that the processing is explained herein.

Further, when the graphic equalizer pattern is stored in the ROM 42, the CPU 31 selects the graphic equalizer pattern at random and instructs the display area 33C to display the graphic equalizer pattern selected at random thereon (Step S30).

When the EQ pattern and the graphic equalizer pattern are displayed on the display area 33B and the display area 33C, respectively, the CPU 31 detects the "Genre" from the ID3TAG data and instructs the display unit 33 to display the dance animation at the typical tempo and the typical rhythm according to the "Genre".

Further, the time of day control unit 41 may measure the tempo of the audio data, and thereby the CPU 31 instructs the display unit 33 to display the EQ pattern to the tempo.

And further, the time of day control unit 41 counts the play time of the audio data, so that the CPU 31 instructs the display area 33A to display the play time and the track number thereon.

And after, the CPU 31 continuously carries on the play of music according to the play signal outputted by operating the play operation button 32C, the play of music according to the tune selection signal of the audio data, the set up of the playing method by the mode button 32A and so on. When the CPU 31 detects the stop signal outputted by operating the play operation button 32C, the CPU 31 finishes the play of music and the display of the EQ pattern.

As described above, according to the graphic data creating and editing system 1 composed of the personal computer 2 and the writ audio player 3, the personal computer 2 carries on the creating and editing processing of the graphic data to be displayed on the wrist audio player 3. Therefore, the personal computer 2 creates the dot pattern of each frame of the graphic data and stores the dot pattern as a file in the graphic data file storage area 26C.

Thereafter, the personal computer 2 reads out ID3TAG data stored in the wrist audio player 3, and displays the "tune's name", the "artist's name", and the "album's title" and also the "year", the "genre", the "play time", the "graphic data" and so on, in detail.

When the personal computer 2 receives the input of the transfer signal for transferring the data to the wrist audio player 3, the personal computer 2 transfers the audio data and the graphic data stored therein, to the wrist audio player 3 and instructs the wrist audio player 3 to write them thereto.

In this time, the personal computer 2 transmits the following control signal to the wrist audio player 3, the control signal for separating and storing the audio data and the graphic data to be transferred to the wrist audio player 3, into each individual storage area provided at the MMC 35, respectively, in the state wherein the audio data and the graphic data are corresponded to each other by the addresses. Therefore, the wrist audio player 3 writes the audio data and the graphic data to the MMC 35, according to the control signal.

Further, the personal computer 2 separates and stores the audio data and the graphic data into each individual storage area, respectively, creates the data format as shown in FIG. 5 wherein the audio data and the graphic data are corresponded to each other by the address, and instructs the wrist audio player 3 to write the data format to the MMC 35.

And further, the personal computer 2 transfers the audio data and the graphic data corresponded to each other by the address, every block composed thereof, to the writ audio player 3, and instructs the wrist audio player 3 to write the audio data and the graphic data to the MMC 35.

The wrist audio player 3 stores the start address of each audio data in the ID3TAG data as an individual management data for individually controlling the audio data. Further, the wrist audio player 3 fixes the start address of each graphic data. Therefore, the wrist audio player 3 is composed so that the wrist audio player 3 can search the graphic data corresponding the audio data at the same time that the wrist audio player 3 searches the audio data from the ID3TAG data.

Further, the wrist audio player 3 reads out the ID3TAG data stored in the MMC 35, when playing music. Therefore, the wrist audio player 3 instructs the display unit 33 to display the index data for specifying the audio data corresponding to the music to be played, in order, wherein the index data is composed of the tune's name, the artist's name, the album's title and so on (refer to FIG. 14).

And further, the wrist audio player 3 instructs the display unit 33 to ordinarily display the dance animation corresponding to the audio data one frame after another frame, thereon (refer to FIG. 15). The wrist audio player 3 stores the genre as a data for specifying the melody of the audio data in the ID1TAG data. Therefore, the wrist audio player 3 instructs the display unit 33 to display the dance animation in the state wherein the dance animation is corresponded to the genre, that is, to the display speed of the dance animation keeps the tempo of the genre.

Therefore, the audio data and the graphic data are separated and stored in each individual storage area of the MMC 35, respectively, wherein the audio data and the graphic data are corresponded to each other by the address. Accordingly, it is possible that the using efficiency of the memory capacity is increased. Further, when the audio data and the graphic data are displayed corresponding to each other, it is possible that the quality of the main data has priority.

For example, according to such a small sized portable player as the wrist audio player 3 according to the embodiment of the present invention, it is generally that the quality and the resolving power of the picture image is not attached importance.

On the other hand, the clear tone quality is required about music.

Therefore, the audio data having a large amount of data is compressed in the encode system as a MP3. On the other hand, the graphic data is vastly compressed without attaching importance to the image quality thereof, or the graphic data roughly expressed in dot patterns as a dance animation is created. Thereafter, the audio data and the graphic data are stored individually so as to be corresponded to each other by the address. Accordingly, it is possible that the tune quality has priority over the image quality.

In Reverse, the image quality may have priority over the tune quality.

Further, the personal computer 2 comprises the function of creating the graphic data and the wrist audio player 3 comprises the function of displaying the graphic data.

Accordingly, the personal computer 2 can easily edit the graphic data as a dance animation and an illustration according to a user's favorite and transfer the graphic data to the wrist audio player 3, thereby the wrist audio player 3 can display the graphic data as the dance animation and the illustration to the rhythm and the tempo of the music to be played. As a result, it is possible to provide the interesting wrist audio player 3 in not only the sense of hearing but also the sense of sight.

And further, the wrist audio player 3 stores the ID3TAG data as an individual management data for individually controlling each audio data in the MMC 35, displays the index data on the display unit 33 on the basis of the ID3TAG data. Accordingly, it is possible that the data on the music played is easily conformed.

Further, the wrist audio player 3 displays the index data to the rhythm and the tempo of the music played. Accordingly, it is possible to provide the interesting wrist audio player 3 in the sense of the sight.

Although the present invention has been explained according to the above-described embodiment, it should also be understood that the present invention is not limited to the embodiment and various changes and modifications may be made to the invention without departing from the gist thereof.

For example, according to the wrist audio player 3, the index data and the graphic data are displayed on the display unit 33, to the rhythm and the tempo of the music played. However, an EL (Electro Luminescence) back light may be provided at the display unit 33, and thereby the EL back light may flash to the rhythm and the tempo of the music.

Further, according to the wrist audio player 3, the index data displayed on the display unit 33 is displayed in order of the tune's name, the artist's name, and the album's title. However, it is not limited to the embodiment. For example, the index data may be displayed in order different from the order as described above. Further, the index data further comprising another data as the words of the song and so on may be displayed according to the audio data played.

Further, according to the embodiment of the present invention, the graphic data creating and editing system 1 is composed of the personal computer 2 and the wrist audio player 3. However, it is not limited to the embodiment. For example, it is possible that the graphic data creating and editing system 1 is applied to, for example, a system composed of a personal computer and a portable telephone having a function of playing a multimedia data, a system composed of a portable information terminal and wrist audio player, and so on.

Figure 18:
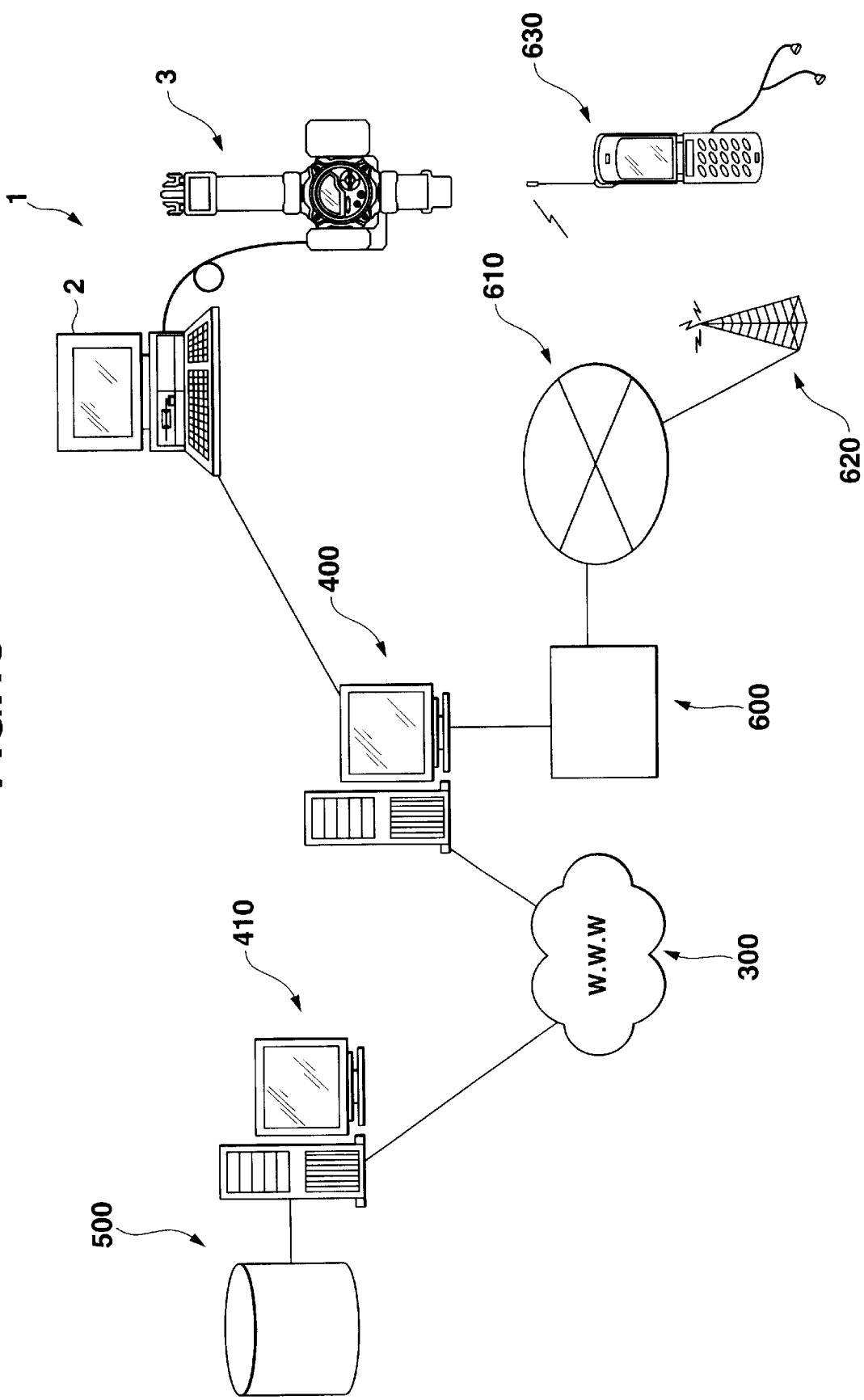
FIG. 18 is a view showing an example that a graphic data creating and editing system of the present invention is expanded to a network.

FIG. 18 is shown an example of this case as described above.

As shown in FIG. 18, the graphic data creating and editing system 1 according to the present invention, is connected and extended to a network system centering around a W.W.W. (World Wide Web) 300.

As shown in FIG. 18, the W.W.W. (World Wide Web) 300 is an information disclosure network. Further, the W.W.W. is connected to a lot of Web servers including Web servers 400 and 410 and a lot of data bases.

The Web server 400 is connected to the personal computer 2 in the graphic data creating and editing system 1 through a public network or a private network. Further, the Web server 400 comprises a function as a network provider for mediating an information communication between the W.W.W. 300, the personal computer 2 and the portable communication terminal 630 according to the requests from the personal computer 2 and the portable communication terminal 630, respectively.

The Web server 410 is connected to the W.W.W. 300 and a database 500. Further, the Web server 410 comprises a function as a contents provider for disclosing and transmitting an information resource stored in the database 500 or a network address (URN: Uniform Resource Locator) obtained through the W.W.W. 300, in confirmed system or at free.

The database 500 stores a media as a graphic data, an audio data and a data capable of being electrically transmitted and an application program, therein. Further, the database 500 receives instructions from the personal computer 2, the portable communication terminal 630 and the Web servers 400 and 410 with the permission of the Web server 410, and thereby the various media and the application program are written to and read out of the database 500.

Further, the application program of the present invention is stored in the state as it is it is compressed in the file form wherein it can be extracted by the apparatus to which it is downloaded, in the database 500.

A network center 600 is connected to the Web server 400 and a radio network 610. Further, when the network center 600 receives the request from the portable communication terminal 630 through a radio station 620, the network center 600 is connected to the Web server 400. Thereby, the network center 600 supplies various network services of the transmission, the download service and so on, of various media, to the portable communication terminal 630.

The portable communication terminal 630 is a digital cellular phone comprising a voice call function in detail. Further, the portable communication terminal 630 further comprises the same function as one of the personal computer 2 and the wrist audio player 3 of the present invention, as an additional function.

That is, according to the network system as described above, it is possible that the personal computer 2 and the portable communication terminal 630 download, install and carry on the application program of the present invention from the database through the W.W.W. 300.

Further, the data format of the audio data is the MP3 data. However, it is not limited to this. For example, the data format of the audio data may adopt an AC (Advanced Audio Coding), an ATRIA (Adaptive Transform Acoustic Coding) or the like, or system combining a plurality of coding systems.

And further, according to the embodiment of the present invention, the wrist audio player has been explained in specially detail. However, it is not limited to the embodiment. It is possible that the wrist audio player is applied to various electronic devices comprising a function of playing an audio data, for example, a PAD, a remote controller and so on.

What is claimed is:

1. A wrist audio player system in which a host computer is electrically connected to an arm-attachable wrist audio player for playing music through a connecting attachment, wherein.

the host computer comprises:
  host storage means for storing animation data expressed by sequentially displaying a plurality of illustrations and audio data for outputting sound; and
  transmitting means for transmitting the animation data and the audio data stored in the host storage means to the wrist audio player, the arm-attachable wrist audio player comprising:
  an arm-attachable player body comprising a wrist band portion for attachment to an arm;
  an earphone connecting portion placed at one side of the player body;
  an outer equipment connecting portion placed at another side of the player body;
  animation data storage means for storing the animation data transmitted from the host computer through the outer equipment connecting portion;
  audio data storage means for storing the audio data transmitted from the host computer through the outer equipment connecting pardon; and
  display means for sequentially displaying animation corresponding to the animation data stored in the animation data storage means at a time of playing the audio data stored in the audio storage means.

2. An arm-attachable wrist audio player device for playing music to which a host computer is electrically connected through a connecting attachment, comprising:
  an arm-attachable player body comprising a wrist band portion for attachment to an arm;
  an earphone connecting portion placed at one side of the player body;
  an outer equipment connecting portion placed at another side of the player body;
  animation data storage means for storing animation data expressed by sequentially displaying a plurality of illustrations transmitted from the host computer through the outer equipment connecting portion;
  audio data storage means for storing audio data transmitted from the host computer through the outer equipment connecting portion; and
  display means for sequentially displaying animation corresponding to the animation data stored in the animation data storage means at a time of playing the audio data stored in the audio data storage means.

* * * * *